(12) United States Patent
Lee

(10) Patent No.: US 10,885,993 B2
(45) Date of Patent: Jan. 5, 2021

(54) SEMICONDUCTOR MEMORY DEVICE AND OPERATING METHOD THEREOF

(71) Applicant: SK hynix Inc., Incheon-si (KR)

(72) Inventor: Hee Youl Lee, Incheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/598,922

(22) Filed: Oct. 10, 2019

(65) Prior Publication Data

US 2020/0185047 A1 Jun. 11, 2020

(30) Foreign Application Priority Data

Dec. 11, 2018 (KR) ........................ 10-2018-0159503

(51) Int. Cl.
 *G11C 16/06* (2006.01)
 *G11C 16/34* (2006.01)
 *G11C 16/10* (2006.01)
 *G11C 7/14* (2006.01)
 *G11C 16/24* (2006.01)
 *G11C 16/08* (2006.01)

(52) U.S. Cl.
 CPC ............ *G11C 16/3459* (2013.01); *G11C 7/14* (2013.01); *G11C 16/08* (2013.01); *G11C 16/10* (2013.01); *G11C 16/24* (2013.01)

(58) Field of Classification Search
 CPC ....... G11C 16/3459; G11C 7/14; G11C 16/08; G11C 16/10; G11C 16/24

USPC .................................................... 365/185.22
See application file for complete search history.

(56) References Cited

U.S. PATENT DOCUMENTS

2015/0348643 A1* 12/2015 Vali .................... G11C 16/3436
                                                          365/185.18
2017/0069372 A1*  3/2017 Kodama ............. H01L 27/1157

FOREIGN PATENT DOCUMENTS

KR    1020150029405 A    3/2015
KR    1020170065240 A    6/2017

* cited by examiner

*Primary Examiner* — Huan Hoang
(74) *Attorney, Agent, or Firm* — William Park & Associates Ltd.

(57) ABSTRACT

A method of operating a semiconductor memory device includes dummy-programming selected memory cells representing all the memory cells to be programmed for a programming operation. The method also includes determining as a first group of memory cells those selected memory cells having threshold voltages less than or equal to a reference threshold voltage and determining as a second group of memory cells those selected memory cells having threshold voltages greater than the reference threshold voltage. The method further includes programming the selected memory cells by applying a first bit line voltage to the memory cells of the first group, applying a second bit line voltage different from the first bit line voltage to the memory cells of the second group, and applying a same program pulse to the memory cells of the first and second groups.

6 Claims, 19 Drawing Sheets

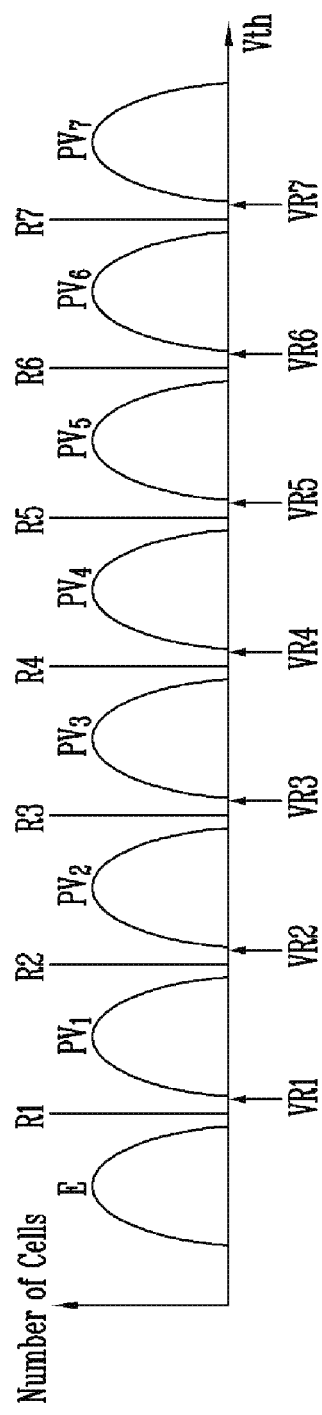
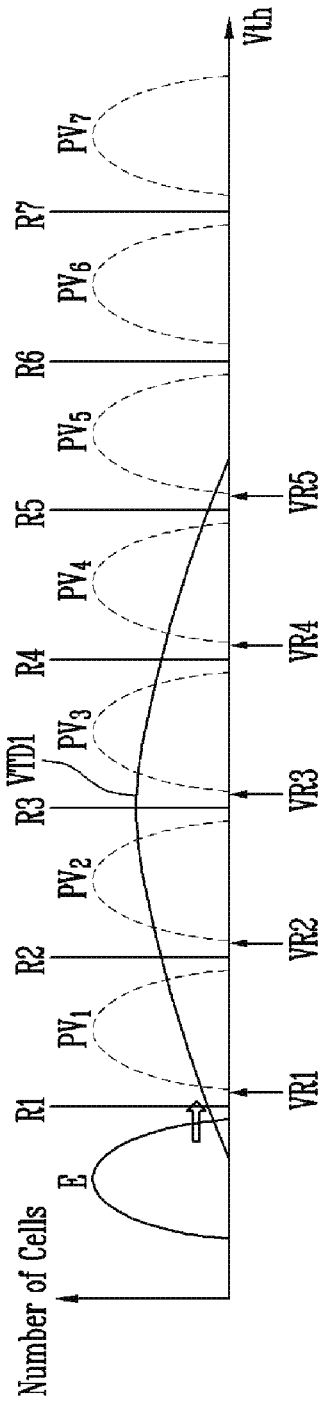

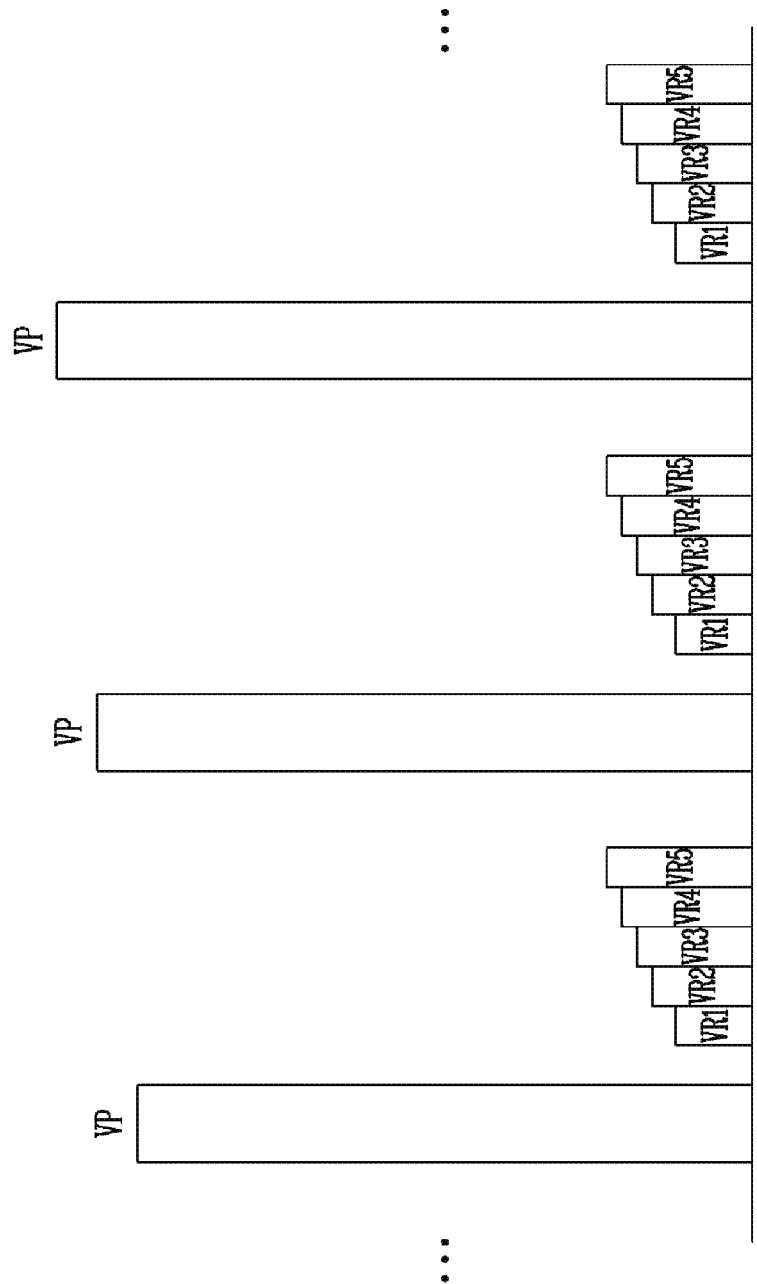

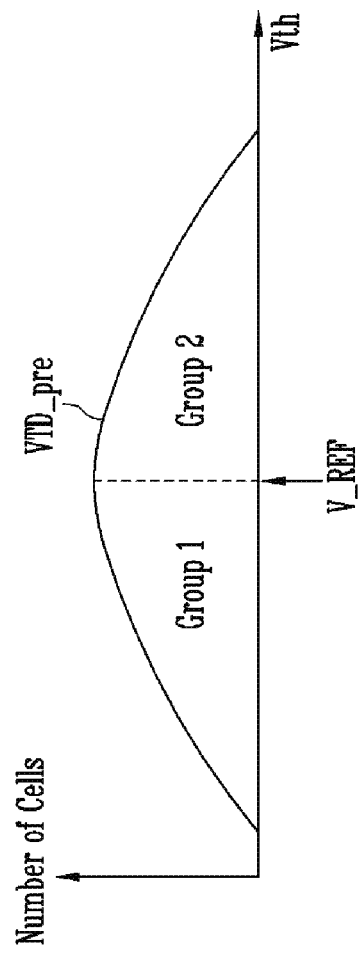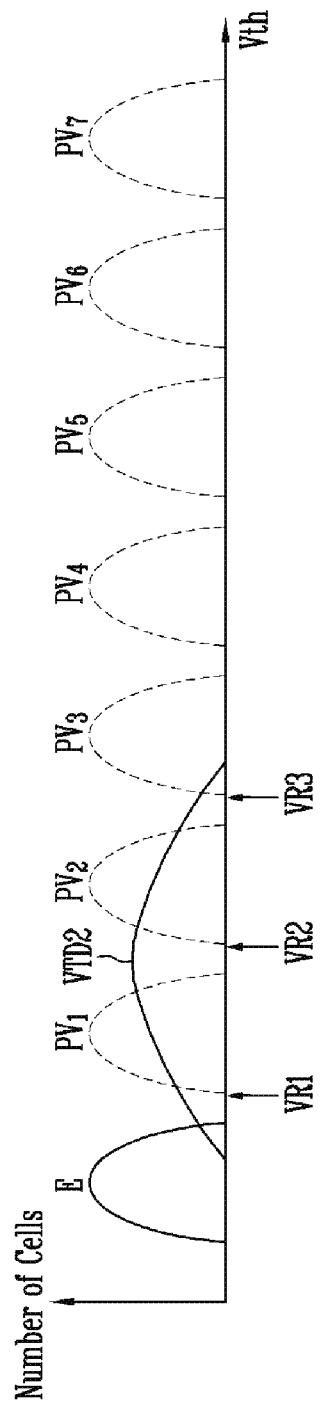

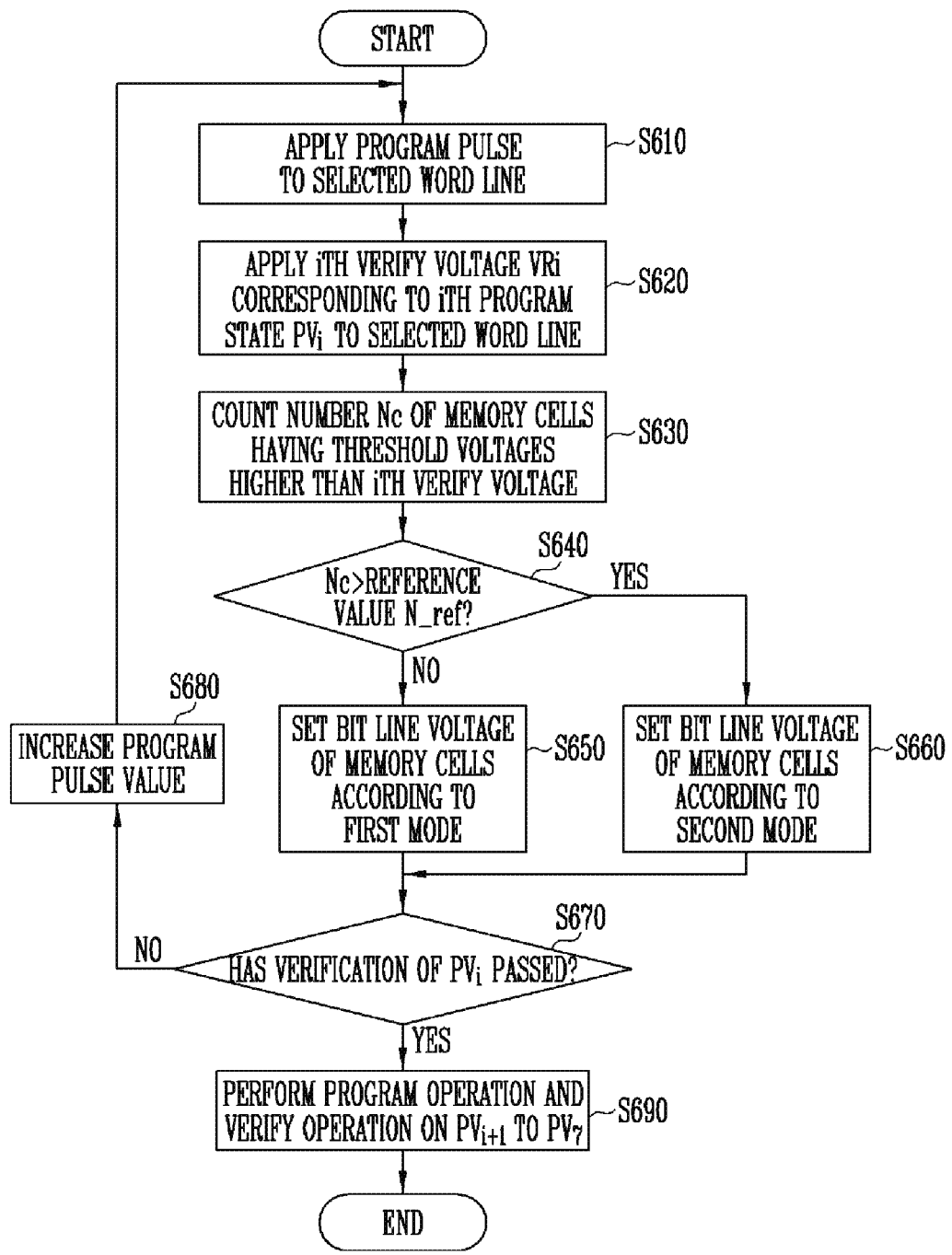

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2018-0159503, filed on Dec. 11, 2018, in the Korean Intellectual Property Office, the entire disclosure of which is incorporated herein by reference.

BACKGROUND

1. Technical Field

The present disclosure generally relates to an electronic device, and more particularly, to a semiconductor memory device and an operating method thereof.

2. Related Art

Memory devices may be formed as two-dimensional structures in which strings are arranged parallel to a semiconductor substrate, or may be formed as three-dimensional structures in which strings are arranged perpendicular to a semiconductor substrate. Three-dimensional memory devices are semiconductor memory device devised to overcome the limit on a degree of integration for two-dimensional memory devices. Three-dimensional memory devices may include a plurality of memory cells vertically stacked on a semiconductor substrate.

SUMMARY

According to an embodiment of the present disclosure, a method of operating a semiconductor memory device includes dummy-programming selected memory cells representing all the memory cells to be programmed for a programming operation. The method also includes determining as a first group of memory cells those selected memory cells having threshold voltages less than or equal to a reference threshold voltage and determining as a second group of memory cells those selected memory cells having threshold voltages greater than the reference threshold voltage. The method further includes programming the selected memory cells by applying a first bit line voltage to the memory cells of the first group, applying a second bit line voltage different from the first bit line voltage to the memory cells of the second group, and applying a same program pulse to the memory cells of the first and second groups.

According to an embodiment of the present disclosure, a method for operating a semiconductor memory device to program selected memory cells to program states among first to Nth program states, N being a natural number, includes applying a first program pulse to a word line coupled to the selected memory cells and performing a first program verify operation by applying an ith verify voltage corresponding to an ith program state to the word line, i being a natural number equal to or greater than 1 and less than or equal to N. The method also includes setting, when the first program verify operation fails, a bit line voltage for memory cells, among the selected memory cells, that have threshold voltages lower than the ith verify voltage to the first bit line voltage. The method further includes setting, when the first program verify operation fails, a bit line voltage for memory cells, among the selected memory cells, that have threshold voltages higher than the ith verify voltage and that are to be programmed to the ith program state to a program inhibit voltage.

According to an embodiment of the present disclosure, a method for operating a semiconductor memory device to program selected memory cells to program states among first to Nth program states, N being a natural number, includes applying a first program pulse to a word line coupled to the selected memory cells and performing a first program verify operation by applying an ith verify voltage corresponding to an ith program state to the word line, i being a natural number equal to or greater than 1 and less than or equal to N. The method also includes determining if a number of the selected memory cells having threshold voltages higher than the ith verify voltage is greater than a reference value and setting bit line voltages for the selected memory cells based on the determination.

According to an embodiment of the present disclosure, a semiconductor memory device includes a memory cell array having a plurality of memory cells configured to store data, a plurality of bit lines coupled to the plurality of memory cells, and a control logic configured to control the peripheral circuit in performing the program operation. The semiconductor memory device, in performing the program operation, is configured to: dummy-program the selected memory cells; determine as a first group of memory cells those selected memory cells having threshold voltages less than or equal to a reference threshold voltage; determine as a second group of memory cells those selected memory cells having threshold voltages greater than the reference threshold voltage; apply a first bit line voltage to bit lines, of the plurality of bit lines, coupled to the memory cells of the first group; apply a second bit line voltage higher than the first bit line voltage to bit lines, of the plurality of bit lines, coupled to the memory cells of the second group; and apply a same program pulse to the memory cells of the first and second groups.

According to an embodiment of the present disclosure, there is provided a method for operating a semiconductor memory device, the method including: dummy-programming selected memory cells to be programmed; comparing threshold voltages of the dummy-programmed memory cells with a predetermined reference threshold voltage, determining, as a first group, memory cells having threshold voltages smaller than or equal to the reference threshold voltage, and determining, as a second group, memory cells having threshold voltages larger than the reference threshold voltage; and programming the selected memory cells by applying a first bit line voltage to the memory cells of the first group and applying a second bit line voltage to the memory cells of the second group.

The second bit line voltage may be larger than the first bit line voltage.

The programming of the selected memory cells may include: applying the first bit line voltage to bit lines coupled to the memory cells of the first group; applying the second bit line voltage to bit lines coupled to the memory cells of the second group; applying a program pulse to a word line coupled to the selected memory cells; and performing a verify operation on the selected memory cells.

According to another embodiment of the present disclosure, there is provided a method for operating a semiconductor memory device, which includes a plurality of program loops to program selected memory cells to any one program state among first to Nth program states, wherein the program loop includes: applying a program pulse to a word line coupled to the selected memory cells; applying an ith verify voltage corresponding to an ith program state to the word line; and setting a bit line voltage of the selected memory cells, based on whether verification of the ith program state has passed, wherein the N is a natural number larger than or equal to 1, and the i is a natural number that is larger than or equal to 1 and is smaller than or equal to N.

The setting of the bit line voltage of the selected memory cells, based on whether the verification of the ith program state has passed, may include, when the verification of the ith program state does not pass, setting the bit line voltage, based on threshold voltages of the selected memory cells.

The setting of the bit line voltage, based on the threshold voltages of the selected memory cells, may include: setting, as a first bit line voltage, a bit line voltage of memory cells having threshold voltages lower than the ith verify voltage among memory cells to be programmed to any one program state among the ith program state to the Nth program state; and setting, as a second bit line voltage, a bit line voltage of memory cells having threshold voltages higher than the ith verify voltage among memory cells to be programmed to any one program state among an (i+1)th program state to the Nth program state.

The second bit line voltage may be larger than the first bit line voltage.

The setting of the bit line voltage, based on the threshold voltages of the selected memory cells, further may include setting, as a program inhibit voltage, a bit line voltage of memory cells having threshold voltages higher than the ith verify voltage among memory cells to be programmed to the ith program state.

The program loop may further include increasing a program pulse value, after the setting of the bit line voltage of the selected memory cells, based on whether the verification of the ith program state has passed.

The setting of the bit line voltage of the selected memory cells, based on whether the verification of the ith program state has passed, may include: when the verification of the ith program state passes, determining whether verification of all program states has passed; and when the verification of all the program states does not pass, increasing the i by 1, and initializing a bit line voltage of memory cells that have not been completely programmed among the selected memory cells.

According to still another embodiment of the present disclosure, there is provided a method for operating a semiconductor memory device, which includes a plurality of program loops to program selected memory cells to any one program state among first to Nth program states, wherein the program loop includes: applying a program pulse to a word line coupled to the selected memory cells; applying an ith verify voltage corresponding to an ith program state to the word line; counting a number of memory cells having threshold voltages higher than the ith verify voltage; comparing the counted result with a predetermined reference value; and setting a bit line voltage of the selected memory cells, based on the comparison result, wherein the N is a natural number larger than or equal to 1, and the i is a natural number that is larger than or equal to 1 and is smaller than or equal to N.

The setting of the bit line voltage of the selected memory cells, based on the comparison result, may include, when the number of memory cells having threshold voltages higher than the ith verify voltage is smaller than or equal to the reference value, setting the bit line voltage, based on threshold voltages of the selected memory cells.

The setting of the bit line voltage, based on the threshold voltages of the selected memory cells, may include: setting, as a first bit line voltage, a bit line voltage of memory cells having threshold voltages lower than the ith verify voltage among memory cells to be programed to any one program state among the ith program state to the Nth program state; and setting, as a second bit line voltage larger than the first bit line voltage, a bit line voltage of memory cells having threshold voltages higher than the ith verify voltage among memory cells to be programmed to any one program state among an (i+1)th program state to the Nth program state.

The setting of the bit line voltage, based on the threshold voltages of the selected memory cells, may further include setting, a program inhibit voltage, a bit line voltage of memory cells having threshold voltages higher than the ith verify voltage among memory cells to be programmed to the ith program state.

The setting of the bit line voltage of the selected memory cells, based on the comparison result, may include, when the number of memory cells having threshold voltages higher than the ith verify voltage is larger than the reference value, setting, as a first bit line voltage, bit line voltages of memory cells having threshold voltages lower than the ith verify voltage among memory cells to be programmed to the ith program state and memory cells to be programmed to any one program state among an (i+1)th program state to the Nth program state.

The setting of the bit line voltage of the selected memory cells, based on the comparison result, may further include setting, as a program inhibit voltage, a bit line voltage of memory cells having threshold voltages higher than the ith verify voltage among the memory cells to be programmed to the ith program state.

The program loop may further include determining whether verification of the ith program state has passed, after the setting of the bit line voltage of the selected memory cells, based on the comparison result.

The program loop may further include, when the verification of the ith program state does not pass, increasing a program pulse value.

According to yet another embodiment of the present disclosure, there is provided a semiconductor memory device including: a memory cell array including a plurality of memory cells; a peripheral circuit configured to perform a program operation on selected memory cells among the memory cells included in the memory cell array; and a control logic configured to control the program operation of the peripheral circuit, wherein the semiconductor memory device controls the peripheral circuit to dummy-program the selected memory cells to be programmed, wherein the semiconductor memory device divides the dummy-programmed memory cells into a first group and a second group, based on a predetermined reference threshold voltage, wherein the semiconductor memory device controls the peripheral circuit to program the selected memory cells by applying a first bit line voltage to the memory cells of the first group and applying a second bit line voltage to the memory cells of the second group.

BRIEF DESCRIPTION OF THE DRAWINGS

Example embodiments are described hereinafter with reference to the accompanying drawings; however, they may be embodied in different forms and should not be construed as being limited to the descriptions set forth herein. Rather, these embodiments are provided to make the present disclosure clear and enabling to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout the drawings.

FIG. 6 is a diagram illustrating a threshold voltage distribution of Triple Level Cells (TLC).

FIG. 7 is a diagram illustrating a threshold voltage distribution of memory cells according to a variation in program speed between the memory cells.

FIG. 8 is a graph illustrating a portion of a program operation of memory cells having a distribution state shown in FIG. 7.

FIG. 12 is a diagram illustrating a threshold voltage distribution of dummy-programmed memory cells.

FIG. 13 is a diagram illustrating a threshold voltage distribution of memory cells while the memory cells are being programmed, according to an embodiment of the present disclosure.

FIG. 18 is a flowchart illustrating an operating method of a semiconductor memory device, according to an embodiment of the present disclosure.

DETAILED DESCRIPTION

Figure 1:
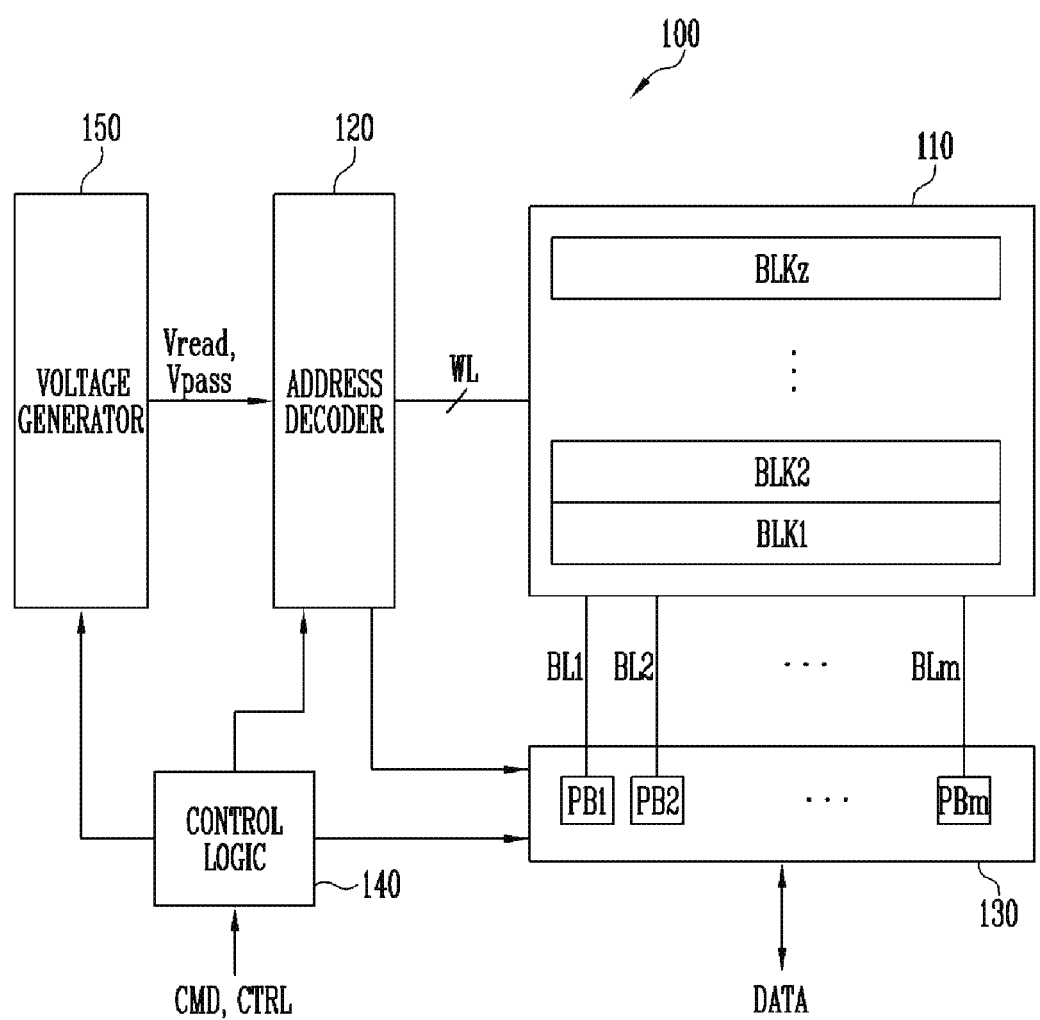
FIG. 1 is a block diagram illustrating a semiconductor memory device, according to an embodiment of the present disclosure.

In the present disclosure, advantages, features, and methods for achieving them will become more apparent after reading the following embodiments taken in conjunction with the drawings. The present disclosure may, however, be embodied in different forms and should not be construed as being limited to the embodiments set forth herein. Rather, these embodiments are provided to describe the present disclosure in detail to the extent that those skilled in the art to which the disclosure pertains may understand the technical concept of the present disclosure.

In the specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless explicitly stated otherwise.

Hereinafter, embodiments of the present disclosure are described in detail with reference to the accompanying drawings. The same reference numerals are used to designate the same elements as those shown in other drawings. In the following descriptions, only portions necessary for understanding operations according to the embodiments are described, and descriptions of the other portions may be omitted so as to not obscure important concepts of the embodiments.

FIG. 1 is a block diagram illustrating a semiconductor memory device, according to an embodiment of the present disclosure.

Referring to FIG. 1, the semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The plurality of memory blocks BLK1 to BLKz are coupled to the address decoder 120 through word lines WL. The plurality of memory blocks BLK1 to BLKz are coupled to the read/write circuit 130 through bit lines BL1 to BLm. Each of the plurality of memory blocks BLK1 to BLKz includes a plurality of memory cells. In an embodiment, the plurality of memory cells are nonvolatile memory cells, and may be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Each of the plurality of memory cells included in the memory cell array 110 may store data of at least one bit. In an embodiment, each of the plurality of memory cells included in the memory cell array 110 may be a Single Level Cell (SLC) that stores data of one bit. In another embodiment, each of the plurality of memory cells included in the memory cell array 110 may be a Multi Level Cell (MLC) that stores data of two bits. In still another embodiment, each of the plurality of memory cells included in the memory cell array 110 may be a Triple Level Cell (TLC) that stores data of three bits. In still another embodiment, each of the plurality of memory cells included in the memory cell array 110 may be a Quad Level Cell (QLC) that stores data of four bits. In some embodiments, the memory cell array 110 may include a plurality of memory cells that each stores data of five or more bits.

The address decoder 120, the read/write circuit 130, the control logic 140, and the voltage generator 150 operate as a peripheral circuit that drives the memory cell array 110. The address decoder 120 is coupled to the memory cell array 110 through the word lines WL. The address decoder 120 operates under the control of the control logic 140. The address decoder 120 receives an address through an input/output buffer (not shown) provided in the semiconductor memory device 100.

The address decoder 120 decodes a block address in the received address. The address decoder 120 selects at least one memory block according to the decoded block address. In a read voltage application operation during a read operation, the address decoder 120 applies a read voltage Vread generated by the voltage generator 150 to a selected word line among the selected memory blocks, and applies a pass voltage Vpass to the other unselected word lines. In a program verify operation, the address decoder 120 applies a verify voltage generated by the voltage generator 150 to the selected word line among the selected memory blocks, and applies the pass voltage Vpass to the other unselected word lines.

The address decoder 120 decodes a column address in the received address. The address decoder 12 transmits the decoded column address to the read/write circuit 130.

Read and program operations of the semiconductor memory device 100 are performed in units of pages. An address received in a request of the read operation and the program operation includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation of the memory cell array 110, and operate as a "write circuit" in a write operation of the memory cell array 110. The plurality of page buffers PB1 to PBm are connected to the memory cell array 110 through the bit lines BL1 to BLm. In order to sense threshold voltages of memory cells in the read operation and the program verify operation, the plurality of page buffers PB1 to PBm sense a change and amount of current flowing depending on a program state of a corresponding memory cell while continuously supplying sensing current to bit lines connected to the memory cells, and latch the sensed charge as sensing data. The read/write circuit 130 operates in response to page buffer control signals output from the control logic 140.

In the read operation, the read/write circuit 130 temporarily stores read data by sensing data of a memory cell and then outputs data DATA to the input/output buffer (not shown) of the semiconductor memory device 100. In an embodiment, the read/write circuit 130 may include a column selection circuit, and the like, in addition to the page buffers (or page registers).

The control logic 140 is connected to the address decoder 120, the read/write circuit 130, and the voltage generator 150. The control logic may be implemented as hardware, software, or a combination thereof. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. Also, the control logic 140 outputs a control signal for controlling sensing node precharge potential levels of the plurality of page buffers PB1 to PBm. The control logic 140 may control the read/write circuit 130 to perform the read operation of the memory cell array 110.

In the read operation, the voltage generator 150 generates the read voltage Vread and the pass voltage Vpass in response to a control signal output from the control logic 140. In order to generate a plurality of voltages having various voltage levels, the voltage generator 150 may include a plurality of pumping capacitors for receiving an internal power voltage, and generate a plurality of voltages by selectively activating the plurality of pumping capacitors under the control of the control logic 140. The voltage generator 150 may include a charge pump, and the charge pump may include the plurality of pumping capacitors. The configuration of the charge pump included in the voltage generator 150 may differ for different embodiments.

The address decoder 120, the read/write circuit 130, and the voltage generator 150 may serve as a "peripheral circuit" that performs a read operation, a write operation, and an erase operation on the memory cell array 110. The peripheral circuit performs the read operation, the write operation, and the erase operation on the memory cell array 110 under the control of the control logic 140.

For the semiconductor memory device 100 and an operating method thereof, according to an embodiment of the present disclosure, the control logic 140 controls the peripheral circuit to dummy-program memory cells selected as a program target among the memory cells of the memory cell array 110. The control logic 140 divides the dummy-programmed memory cells into a first group and a second group by comparing threshold voltages of the dummy-programmed memory cells with a reference threshold voltage. Subsequently, the control logic 140 controls the peripheral circuit to perform a program operation by applying different bit line voltages to memory cells of the first group and memory cells of the second group.

The program operation is performed to relatively decrease a program speed of a fast cell among the selected memory cells. Thus, a variation in threshold voltage between memory cells is decreased, so that the number of times that a program verify operation is performed can be decreased. Consequently, the program speed of the semiconductor memory device is improved. A configuration in which the number of times that the program verify operation is performed is decreased by decreasing the program speed of the fast cell among the selected memory cells according to the above-described embodiment is described below with reference to FIGS. 6 to 14.

Meanwhile, according to the semiconductor memory device and an operating method thereof according to another embodiment of the present disclosure, the control logic 140 controls the peripheral circuit to perform a plurality of program loops so as to program selected memory cells included in the memory cell array 110 to any one program state among first to Nth program states. In the program loop, the control logic 140 controls the peripheral circuit to apply a program pulse to a word line coupled to the selected memory cells, controls the peripheral circuit to apply an ith verify voltage corresponding to an ith program state to the word line, and sets a bit line voltage of the selected memory cells, based on whether verification of the ith program state has passed. Here, N may be a natural number larger than or equal to 1, and i may be a natural number that is larger than or equal to 1 and is smaller than or equal to N. A configuration in which the number of times that the program verify operation is performed is decreased by decreasing the program speed of the fast cell among the selected memory cells according to the above-described embodiment is described below with reference to FIGS. 15 to 17B.

Meanwhile, according to the semiconductor memory device and an operating method thereof according to another embodiment of the present disclosure, the control logic 140 controls the peripheral circuit to perform a plurality of program loops so as to program selected memory cells included in the memory cell array 110 to any one program state among first to Nth program states. In the program loop, the control logic 140 controls the peripheral circuit to apply a program pulse to a word line coupled to the selected memory cells, controls the peripheral circuit to apply an ith verify voltage corresponding to an ith program state to the word line, counts a number of memory cells having threshold voltages higher than the ith verify voltage and then compares the counted number with a predetermined reference value, and sets a bit line voltage of the selected memory cells, based on the comparison result. Here, N may be a natural number larger than or equal to 1, and i may be a natural number that is larger than or equal to 1 and is smaller than or equal to N. A configuration in which the number of times that the program verify operation is performed is decreased by decreasing the program speed of the fast cell among the selected memory cells according to the above-described embodiment is described below with reference to FIGS. 18 to 20.

Figure 2:
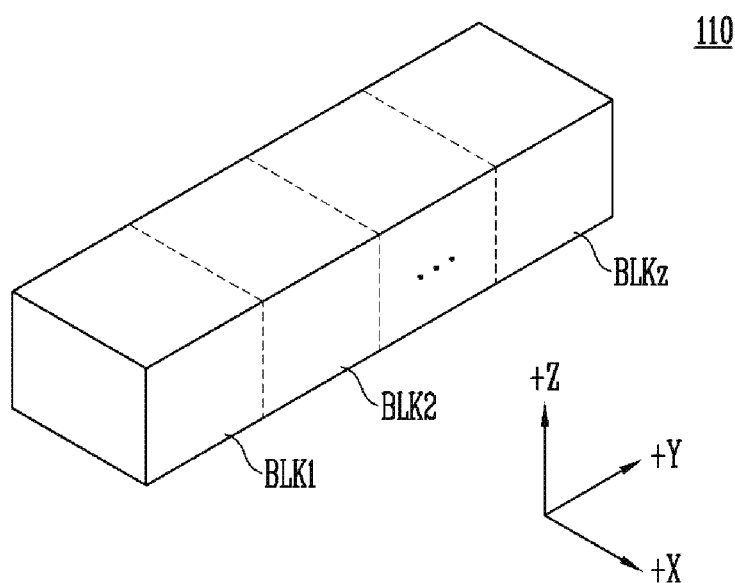
FIG. 2 is a diagram illustrating an embodiment of a memory cell array shown in FIG. 1.

FIG. 2 is a diagram illustrating an embodiment of the memory cell array shown in FIG. 1.

Referring to FIG. 2, the memory cell array 110 includes a plurality of memory blocks BLK1 to BLKz. Each memory block has a three-dimensional structure. Each memory block includes a plurality of memory cells stacked above a substrate. The plurality of memory cells are arranged along +X, +Y, and +Z directions. The structure of each memory block is described in more detail with reference to FIGS. 3 and 4.

Figure 3:
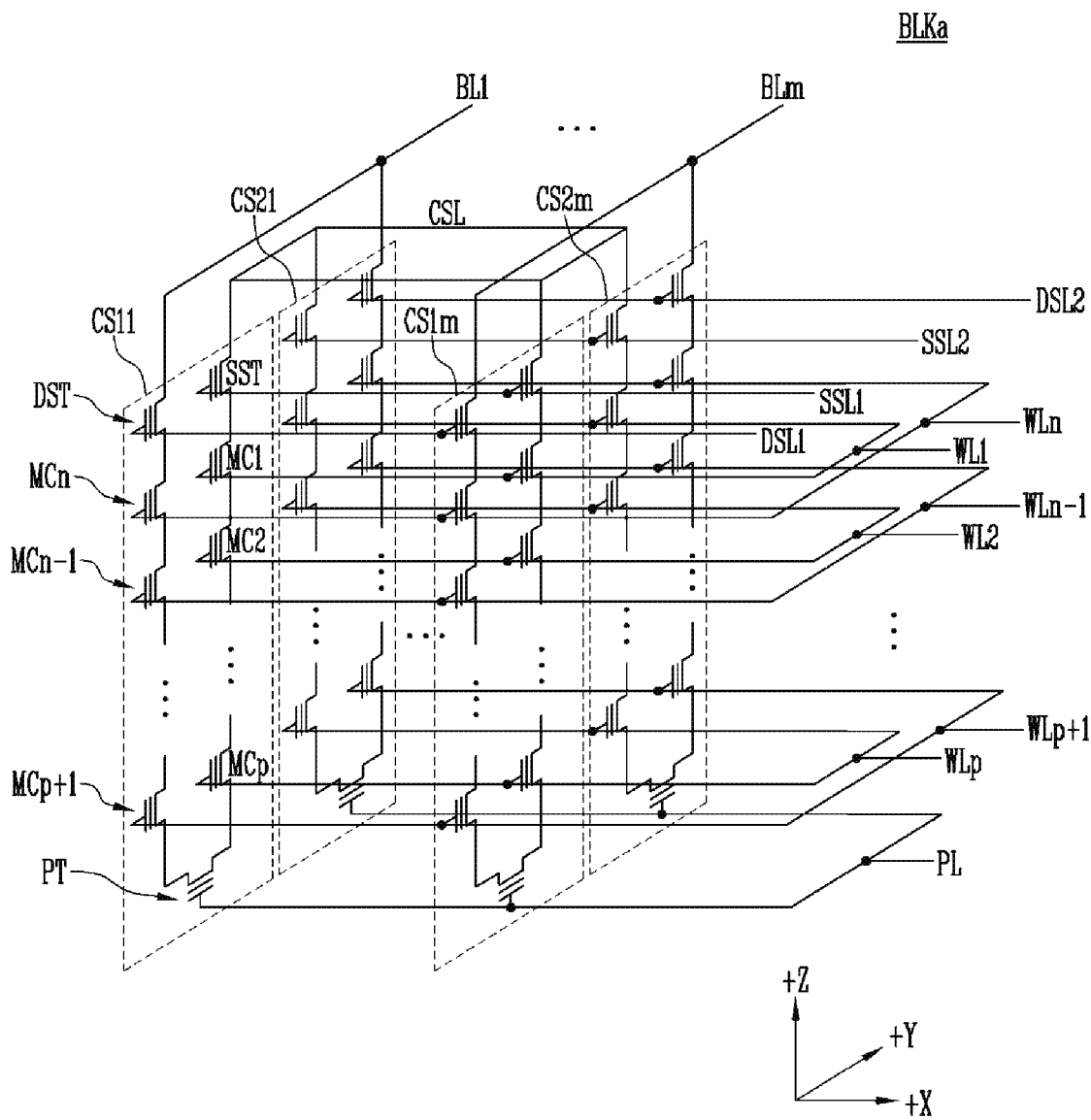
FIG. 3 is a circuit diagram illustrating a memory block among memory blocks shown in FIG. 2.

FIG. 3 is a circuit diagram illustrating a memory block BLKa among the memory blocks BLK1 to BLKz shown in FIG. 2.

Referring to FIG. 3, the memory block BLKa includes a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). In FIG. 3, it is illustrated that two cell strings are arranged in a column direction (i.e., a +Y direction). However, this is for convenience of description. In different embodiments, different numbers of cell strings may be arranged in the column direction. For example, three cell strings may be arranged in the column direction.

Each of the plurality of cell strings CS11 to CS1m and CS21 to CS2m includes at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 3, the source select transistors of the cell strings CS11 to CS1m on a first row are coupled to a first source select line SSL1. The source select transistors of the cell strings CS21 to CS2m on a second row are coupled to a second source select line SSL2.

In another embodiment, the source select transistors of the cell strings CS11 to CS1m and CS21 to CS2m may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 3, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. When any one of the drain select lines DSL1 and DSL2 is selected, cell strings arranged in one row direction may be selected. When any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1*m* or CS21 to CS2*m* arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, each of the dummy memory cells may have a threshold voltage. Before or after an erase operation of the memory block BLKa, a program operation may be performed on all or some of the dummy memory cells. When an erase operation is performed after the program operation is performed, the threshold voltages of the dummy memory cells control voltages are applied to the dummy word lines coupled to the respective dummy memory cells, so that each of the dummy memory cells can have the threshold voltage.

Figure 4:
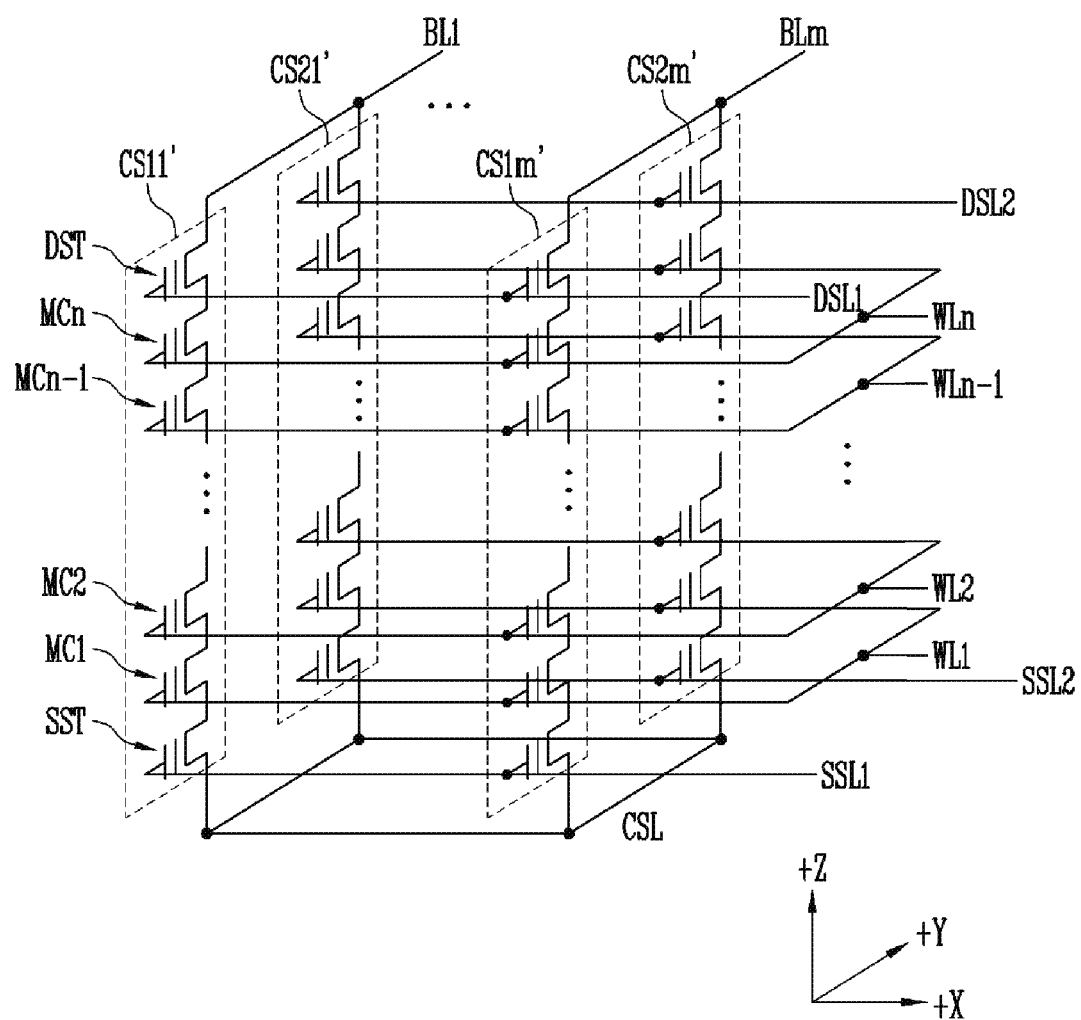
FIG. 4 is a circuit diagram illustrating another embodiment of a memory block among the memory blocks shown in FIG. 2.

FIG. 4 is a circuit diagram illustrating, in accordance with another embodiment, a memory block BLKb among the memory blocks BLK1 to BLKz shown in FIG. 2.

Referring to FIG. 4, the memory block BLKb includes a plurality of cell strings CS11' to CS1*m*' and CS21' to CS2*m*'. Each of the plurality of cell strings CS11' to CS1*m*' and CS21' to CS2*m*' extends along the +Z direction. Each of the plurality of cell strings CS11' to CS1*m*' and CS21' to CS2*m*' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1*m*' arranged on a first row are coupled to a first source select line SSL1. Source select transistors of the cell strings CS21' to CS2*m*' arranged on a second row are coupled to a second source select line 55L2. In another embodiment, the source select transistors of the cell strings CS11' to CS1*m*' and CS21' to CS2*m*' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1*m*' on the first row are coupled to a first drain select line DSL1. The drain select transistors of the cell strings CS21' to CS2*m*' on the second row are coupled to a second drain select line DSL2.

Consequently, the memory block BLKb of FIG. 4 has a circuit matching that of the memory block BLKa of FIG. 3, except that the pipe transistors PT of the memory block BLKa are excluded from the cell strings of the memory block BLKb.

In another embodiment, even bit lines and odd bit lines may be provided instead of the first to mth bit lines BL1 to BLm. In addition, even-numbered cell strings among the cell strings CS11' to CS1*m*' or CS21' to CS2*m*' arranged in the row direction may be coupled to the even bit lines, respectively, and odd-numbered cell strings among the cell strings CS11' to CS1*m*' or CS21' to CS2*m*' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb increases. When the number of dummy memory cells decreases, the size of the memory block BLKb decreases. On the other hand, the reliability of an operation of the memory block BLKb may be deteriorated.

In order to efficiently control the at least one dummy memory cell, each of the dummy memory cells may have a threshold voltage. Before or after an erase operation of the memory block BLKb, a program operation may be performed on all or some of the dummy memory cells. When an erase operation is performed after the program operation is performed, the threshold voltages of the dummy memory cells control voltages are applied to the dummy word lines coupled to the respective dummy memory cells, so that each of the dummy memory cells can have required threshold voltage.

Figure 5:
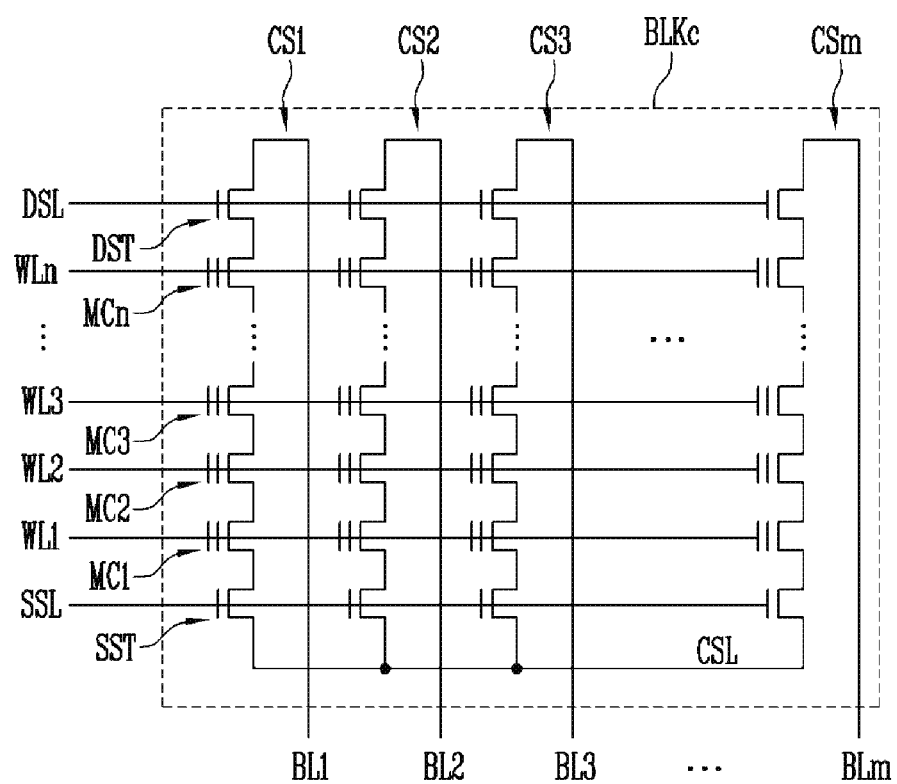
FIG. 5 is a circuit diagram illustrating an embodiment of a memory block among a plurality of memory blocks included in the memory cell array shown in FIG. 1.

FIG. 5 is a circuit diagram illustrating, in accordance with another embodiment, a memory block BLKc among the plurality of memory blocks BLK1 to BLKz included in the memory cell array 110 shown in FIG. 1.

Referring to FIG. 5, the memory block BLKc includes a plurality of strings CS1 to CSm. The plurality of strings CS1 to CSm may be coupled to a plurality of bit lines BL1 to BLm, respectively. Each of the plurality of strings CS1 to CSm includes at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and the memory cells MC1 to MCn.

The first to nth memory cells MC1 to MCn of each cell string are coupled between the source select transistor SST and the drain select transistor DST.

The drain select transistor DST of each cell string is coupled between a corresponding bit line and the memory cells MC1 to MCn.

Memory cells coupled to the same word line constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm arranged may be coupled to the even bit lines, respectively, and odd-numbered cell strings among the cell strings CS1 to CSm may be coupled to the odd bit lines, respectively.

As shown in FIGS. 2 to 4, the memory cells of the memory cell array 110 may be formed as a three-dimensional structure. As shown in FIG. 5, the memory cells of the memory cell array 110 may also be formed as a two-dimensional structure.

FIG. 6 is a diagram illustrating a threshold voltage distribution of Triple Level Cells (TLC).

Referring to FIG. 6, in the case of a TLC that stores data of three bits, a threshold voltage of each of memory cells is included in any one of eight distribution states. That is, according to data stored in the TLC, the threshold voltage of each of the corresponding memory cells is included in an erase state E or any one of first to seventh program states $PV_1$ to $PV_7$.

In order to program memory cells to threshold voltage states shown in FIG. 6, first to seventh verify voltages VR1 to VR7 may be used. In the case of memory cells to be programmed to the first program state $PV_1$, a verify operation is performed based on the first verify voltage VR1 during a program operation. That is, a program inhibit voltage is applied to a bit line coupled to a memory cell having a threshold voltage larger than the first verify voltage VR1 among the memory cells to be programmed to the first program state $PV_1$ as the verification result, so that the threshold voltage is controlled not to be increased even when a subsequent program pulse is applied. Meanwhile, a program allow voltage is applied to a bit line coupled to a memory cell having a threshold voltage smaller than the first verify voltage VR1 among the memory cells to be programmed to the first program state $PV_1$, so that the threshold voltage is increased when a subsequent program pulse is applied. In this manner, the verify operation is performed on memory cells to be programmed to the second to seventh program states $PV_2$ to $PV_7$ respectively through the second to seventh verify voltages VR2 to VR7.

FIG. 7 is a diagram illustrating a threshold voltage distribution of memory cells according to a variation in program speed between the memory cells.

Referring to FIG. 7, threshold voltage states of memory cells while a program operation is being performed are illustrated. That is, a program pulse may be applied to memory cells to be programmed to any one of the first to seventh program states $PV_1$ to $PV_7$ among memory cells that are in the erase state E at an early stage of the program operation. Accordingly, a threshold voltage of each of the corresponding memory cells that are in the erase state E is increased, to have a distribution of an intermediate state VTD1. The intermediate state VTD1 represents a threshold voltage distribution at a specific time before all memory cells to be programmed are completely programmed.

Memory cells on which the program operation is to be performed may have different program speeds depending on their characteristics. Accordingly, although a program pulse having the same magnitude is applied to a word line coupled to memory cells to be programmed, a threshold voltage of each of memory cells is more increased when the memory cells are fast cells, and a threshold voltage of each of memory cells is less increased when the memory cells are slow cells. When a variation in program speed between the memory cells selected as described above is large, the distribution width of the intermediate state VTD1 is widely formed as shown in FIG. 7.

In the example shown in FIG. 7, it can be seen that the distribution of the intermediate state VTD1 is widely formed to include the first to fifth verify voltages VR1 to VR5. In a verify operation performed just after the program pulse is applied, the first to fifth verify voltages VR1 to VR5 are all to be applied. That is, it is determined whether memory cells to be programmed to the first program state $PV_1$ among the memory cells having the threshold voltage distribution of the intermediate state VTD1 have been completely programmed through the first verify voltage VR1. In addition, it is determined whether memory cells to be programmed to the second program state $PV_2$ have been completely programmed through the second verify voltage VR2. In this manner, it is determined whether memory cells to be programmed to the fifth program state $PV_5$ have been completely programmed through the fifth verify voltage VR5. When a verify operation using the fifth verify voltage VR5 is omitted, the memory cells to be programmed to the fifth program state $PV_5$ may be over-programmed.

However, because the distribution of the intermediate state VTD1 does not include the sixth and seventh verify voltages VR6 and VR7, verify operations using the sixth and seventh verify voltages VR6 and VR7 may be omitted.

FIG. 8 is a graph illustrating a portion of a program operation of the memory cells having the distribution state shown in FIG. 7.

Referring to FIG. 8, a portion of a program operation using an Incremental Step Pulse Program (ISPP) method is illustrated. That is, the program operation includes a plurality of program loops, and each program loop includes a step of increasing threshold voltages of memory cells by applying a program pulse VP and steps of performing program verification of the memory cells by applying verify voltages VR1 to VR5. Three program loops are illustrated in FIG. 8.

Referring to FIGS. 7 and 8 together, when a variation in program speed between memory cells is large, as shown in FIG. 7, verify operations using the first to fifth verify voltages VR1 to VR5 are all to be performed for every program loop. When verify operations using five verify voltages VR1 to VR5 are performed as described above, verification takes a long time. However, when a verify operation using a partial verify voltage, e.g., the fifth verify voltage VR5 is omitted so as to reduce the verification time, some of the memory cells to be programmed to the fifth program state $PV_5$ may be over-programmed.

For a semiconductor memory device and an operating method thereof, according to an embodiment of the present disclosure, memory cells to be programmed are dummy-programmed, and the dummy-programmed memory cells are divided into a first group and a second group, based on a reference threshold voltage. Subsequently, selected memory cells are programmed by applying a first bit line voltage to memory cells of the first group and applying a second bit line voltage to memory cells of the second group. Accordingly, a program speed of a fast cell is relatively decreased, and therefore, a variation in threshold voltage between memory cells being programmed is decreased.

Thus, the number of times that a verify operation is performed in the program operation can be decreased, and accordingly, the program speed of the semiconductor memory device can be improved.

Figure 9:
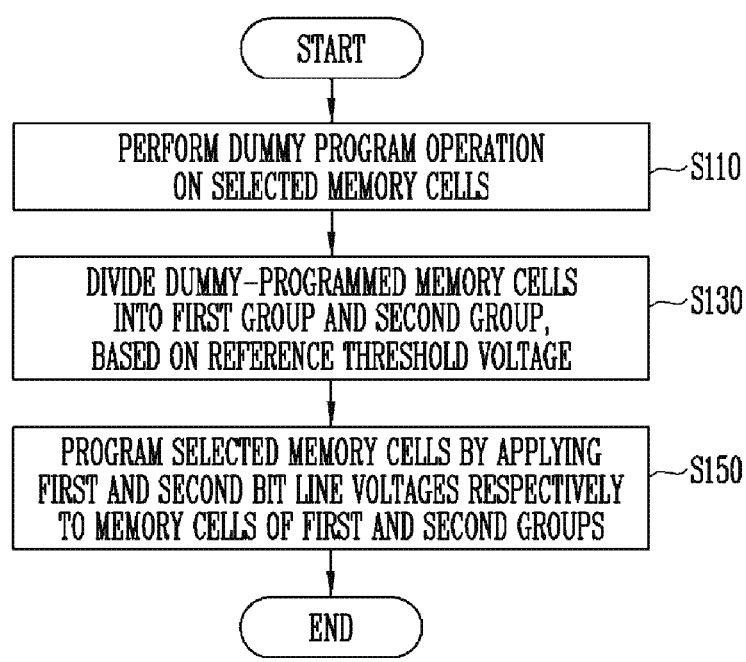
FIG. 9 is a flowchart illustrating an operating method of a semiconductor memory device, according to an embodiment of the present disclosure.

FIG. 9 is a flowchart illustrating an operating method of the semiconductor memory device 100, according to an embodiment of the present disclosure.

Referring to FIG. 9, according to the operating method of the semiconductor memory device 100 according to the embodiment of the present disclosure, selected memory cells are dummy-programmed (S110), the dummy-programmed memory cells are divided into a first group and a second group, based on a reference threshold voltage (S130), and the selected memory cells are programmed by applying first and second bit line voltages, respectively, to the memory cells of the first and second groups (S150).

In the step S110, memory cells included in a physical page to be programmed are dummy-programmed. Referring to FIGS. 6 and 9 together, in the step S110, memory cells to be programmed to the first to seventh program states $PV_1$ to $PV_7$ among all the memory cells that are in the erase state E at the early state of the program operation are dummy-programmed (dummy program operation). Accordingly, a program inhibit voltage is applied to a bit line coupled to memory cells that are to maintain the erase state E among all the memory cells that are in the erase state E at the early state of the program operation, a program allow voltage is applied to the memory cells to be programmed to the first to seventh program states $PV_1$ to $PV_7$, and a program pulse is applied to a word line coupled to the selected memory cells. Therefore, threshold voltages of the memory cells to be programmed to the first to seventh program states $PV_1$ to $PV_7$ are increased.

In the dummy program operation of the step S110, the program pulse may be applied at least once to the word line coupled to the selected memory cells. The number of times that the program pulse is applied in the dummy program operation of the step S110 may be different in different embodiments.

In the step S130, the memory cells for which the threshold voltages are increased according to the dummy program operation of the step S110 are divided into a first group and a second group, based on a predetermined reference threshold voltage. The first group and the second group may be used as groups for dividing relative program speeds of memory cells. More specifically, threshold voltages of the dummy-programmed memory cells is sensed in a state in which the reference threshold voltage is applied to a word line coupled to the dummy-programmed memory cells. As the sensing result, memory cells may be determined as belonging to the first group when the memory cells are on-cells, and memory cells may be determined as belonging to the second group when the memory cells are off-cells. The memory cells of the first group, which are determined as on-cells, may be slow cells having a relatively slow program speed. In addition, the memory cells of the second group, which are determined as off-cells, may be fast cells having a relatively fast program speed. The memory cells of the first group, which are on-cells, and the memory cells of the second group, which are off-cells, are described below with reference to FIG. 12.

In the step S150, the selected memory cells are programmed by applying a first bit line voltage to a bit line coupled to the memory cells of the first group and applying a second bit line voltage to a bit line coupled to the memory cells of the second group. In the step S150, a plurality of program loops may be repeated until the program operation is completed. Meanwhile, a program inhibit voltage is applied to a bit line coupled to memory cells that have been completely programmed to a target program state among the memory cells of the first group and the memory cells of the second group, so that an increase in threshold voltage of the corresponding memory cells can be prevented.

The first bit line voltage may be a program allow voltage. For example, the first bit line voltage may be a ground voltage (0 V). Meanwhile, the second bit line voltage may be a voltage higher than the first bit line voltage. For example, the second bit line voltage may be a value that is larger than 0 V and is smaller than a voltage level of the program pulse.

Because the second bit line voltage is larger than the first bit line voltage, the program speed of memory cells to which the second bit line voltage is applied in a subsequent program operation is decreased. The memory cells of the second group, to which the second bit line voltage is applied, are fast cells having threshold voltages higher than the reference threshold voltage. When a relatively higher bit line voltage is applied to fast cells as described above, the program speed of the fast cells is decreased. Consequently, a variation in program speed between memory cells to be programmed is decreased, and a verify operation can be performed a fewer number of times for every program loop. Accordingly, the entire program speed can be improved.

Figure 10:
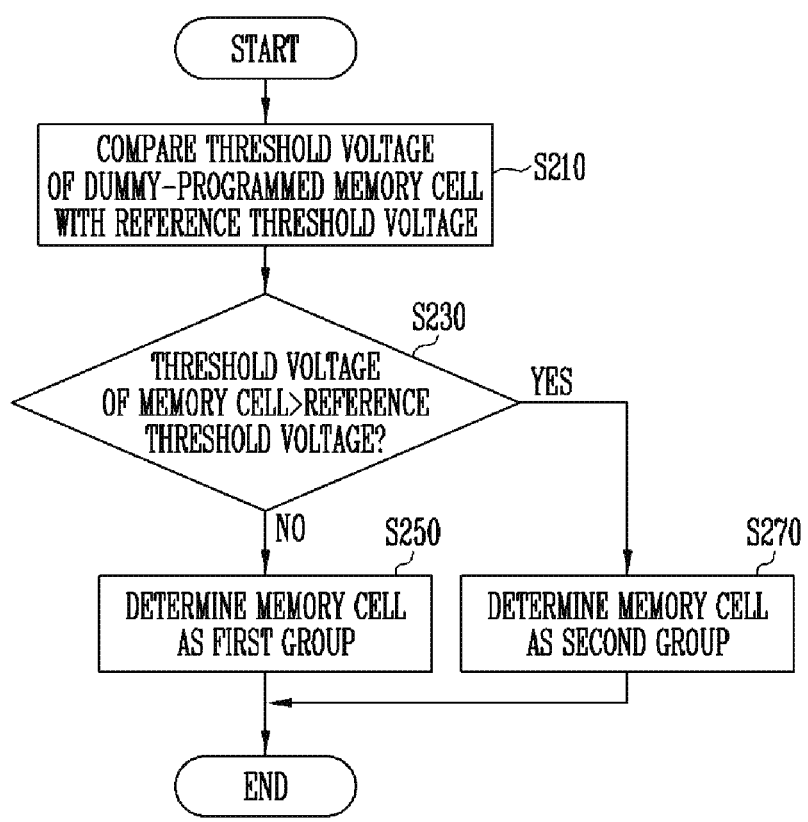
FIG. 10 is a flowchart illustrating in more detail step shown in FIG. 9.

FIG. 10 is a flowchart illustrating in more detail the step S130 shown in FIG. 9.

Referring to FIG. 10, the step S130 of dividing the dummy-programmed memory cells into the first group and the second group includes step S210 of comparing threshold voltages of the dummy-programmed memory cells with a reference threshold voltage and step S230 of determining whether a threshold voltage of a memory cell is larger than the reference threshold voltage. As the determination result of the step S230, when a threshold voltage of a memory cell is not larger than the reference threshold voltage, the corresponding memory cell is determined as belonging to the first group (S250). As the determination result of the step S230, when a threshold voltage of a memory cell is larger than the reference threshold voltage, the corresponding memory cell is determined as belonging to the second group (S270). The steps S210, S230, S250, and S270 shown in FIG. 10 may be performed on each of the dummy-programmed memory cells. When the steps S210, S230, S250, and S270 shown in FIG. 10 are performed, the dummy-programmed memory cells may be sorted as any one of the first group representing slow cells and the second group representing fast cells.

Specifically, in the step S210, threshold voltages of the dummy-programmed memory cells are sensed in a state in which a reference threshold voltage is applied to the word line coupled to the dummy-programmed memory cells. As the sensing result, memory cells may be determined as belonging to a first group when the memory cells are on-cells, and memory cells may be determined as belonging to a second group when the memory cells are off-cells. The reference threshold voltage may be determined as an appropriate value. For example, the reference threshold voltage may be determined as an experimentally determined value. The determination of the reference threshold voltage is described with reference to FIG. 12.

Figure 11:
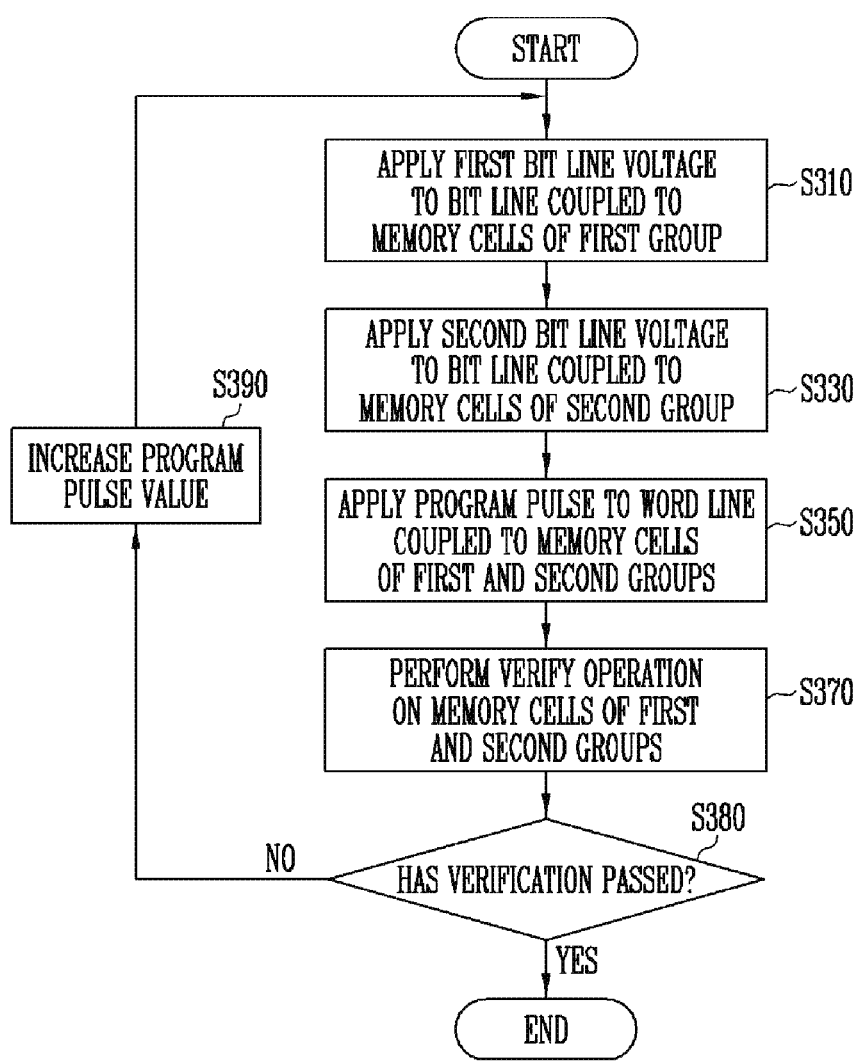
FIG. 11 is a flowchart illustrating, in more detail, an operation shown in FIG. 9.

FIG. 11 is a flowchart illustrating in more detail the step S150 shown in FIG. 9.

Referring to FIG. 11, the step S150 of programming the selected memory cells by applying the first and second bit line voltages, respectively, to the memory cells of the first and second groups includes step S310 of applying the first bit line voltage to a bit line coupled to the memory cells of the first group, step S330 of applying the second bit line voltage to a bit line coupled to the memory cells of the second group, step S350 of applying a program pulse to a word line coupled to the memory cells of the first and second groups, and step S370 of performing a verify operation on the memory cells of the first and second groups. After the verify operation of the step S370 is performed, it is determined whether verification has passed (S380). When the verification passes, the program operation (S150) is ended. When the verification does not pass, a program pulse value is increased (S390), and a subsequent program loop is performed by proceeding to the step S310.

In the step S310, the first bit line voltage is applied to a bit line coupled to memory cells that have not been completely programmed to a target program state among the memory cells of the first group, which are determined as slow cells having a relatively slow program speed. In an embodiment, the first bit line voltage is a program allow voltage, and may be a ground voltage (0 V).

In the step S320, the second bit line voltage is applied to a bit line coupled to memory cells that have not been completely programmed to a target program state among the memory cells of the second group, which are determined as fast cells having a relatively fast program speed. In an embodiment, the second bit line voltage may have a voltage level that is larger than that of the first bit line voltage and is lower than that of a program inhibit voltage.

Although a case where the step S330 is performed after the step S310 is illustrated in FIG. 11, the present disclosure is not limited thereto. That is, the step S310 may be performed after the step S330, and the steps S310 and S330 may be performed at the same time.

Meanwhile, in the steps S310 and S330, it can be seen that the program inhibit voltage is applied to a bit line coupled to memory cells that have been completely programmed to a target program state among the memory cells of the first and second groups.

A program pulse is applied to a word line commonly coupled to the memory cells of the first and second groups in a state in which the first bit line voltage is applied to the bit line coupled to the memory cells of the first group and the second bit line voltage is applied to the bit line coupled to the memory cells of the second group (S350). Accordingly, the threshold voltages of memory cells of the first and second groups are increased. However, the second bit line voltage higher than the first bit line voltage is applied to the bit line coupled to the memory cells of the second group, which are fast cells, and therefore, the program speed of the memory cells of the second group is decreased. Accordingly, a variation in program speed between the memory cells of the first group and the memory cells of the second group is as a whole decreased, and thus a threshold voltage distribution of an intermediate state exists in a narrower range. Accordingly, the number of times that the verify operation performed in the step S370 for each program loop can be decreased, and thus the time required to perform a single program loop is reduced. Consequently, the entire program speed is increased.

In the step S370, a verify operation on the memory cells of the first and second groups is performed. According to the semiconductor memory device and an operating method thereof according to an embodiment of the present disclosure, different bit line voltages are set by dividing memory cells into a first group and a second group, and thus the threshold voltage distribution of the memory cells can be narrowed during a program operation. Accordingly, the number of times that a verify operation is to be performed in the step S370 can be decreased. This is described below with reference to FIGS. 12 and 14.

FIG. 12 is a diagram illustrating a threshold voltage distribution of dummy-programmed memory cells.

Referring to FIG. 12, a threshold voltage distribution VTD_pre formed as a result obtained by performing a dummy program operation on memory cells that are to be programmed to the first to seventh program states $PV_1$ to $PV_7$ among memory cells to be programmed, except memory cells that are to maintain the erase state E, is illustrated.

As described above, in the threshold voltage distribution VTD_pre formed as the result obtained by dummy-programming the memory cells that are to be programmed to the first to seventh program states $PV_1$ to $PV_7$ in the step S110 shown in FIG. 9, memory cells having threshold voltages lower than a reference threshold voltage V_REF may be determined as belonging to a first group Group1, and memory cells having threshold voltages higher than the reference threshold voltage V_REF may be determined as belonging to a second group Group2.

The reference threshold voltage V_REF may be experimentally determined. For example, a threshold voltage distribution VTD_pre roughly formed by dummy-programming multiple times on memory cells in the erase state may be predicted. Based on the predicted threshold voltage distribution VTD_pre, the reference threshold voltage V_REF may be determined such that numbers of memory cells belonging to the first group and the second group are roughly equal to each other.

FIG. 13 is a diagram illustrating a threshold voltage distribution of memory cells while the memory cells are being programmed according to an embodiment of the present disclosure.

Referring to FIG. 13, when the program operation is performed by applying different bit line voltages to the memory cells of the first group and the second group, the threshold voltage distribution of memory cells to be programmed forms an intermediate state VTD2.

For a semiconductor memory device and an operating method thereof according to an embodiment of the present disclosure, after a dummy program operation is performed, different bit line voltages are applied to the memory cells that are divided into slow cells and fast cells. That is, a first bit line voltage is applied to a bit line coupled to the memory cells of the first group Group1, which are slow cells, and a second bit line voltage larger than the first bit line voltage is applied to a bit line coupled to the memory cells of the second group Group2, which are fast cells. Accordingly, the program speed of the fast cells is decreased, and a variation in threshold voltage between the memory cells as a whole decreased. Thus, it can be seen that the distribution of the intermediate state VTD2 is relatively narrowly formed to include the first to third verify voltages VR1 to VR3. Referring to FIGS. 7 and 13 together, when the program operation is performed by applying the same bit line voltage to all the fast cells and the slow cells, a threshold voltage distribution is formed to have the intermediate state VTD1 shown in FIG. 7. When the program operation is performed by applying different bit line voltages, a threshold voltage distribution is formed to have the intermediate state VTD2 shown in FIG. 13. Because the distribution of the intermediate state VTD2 is relatively narrowly formed, as compared to the intermediate state VTD1, to include the first to third verify voltages VR1 to VR3 in FIG. 13, only the first to third verify voltages VR1 to VR3 are applied in a verify operation performed just after the program pulse is applied. That is, although verify operations using the fourth to seventh verify voltages VR4 to VR7 are omitted for the intermediate state VTD2 shown in FIG. 13, the probability that memory cells will be over-programmed is low. Accordingly, the program speed of the fast cells is relatively decreased during the program operation, so that a variation in threshold voltage between memory cells being programmed is decreased. Thus, the number of times that a verify operation is performed in the program operation can be decreased, and accordingly, the program speed of the semiconductor memory device can be improved.

Figure 14:
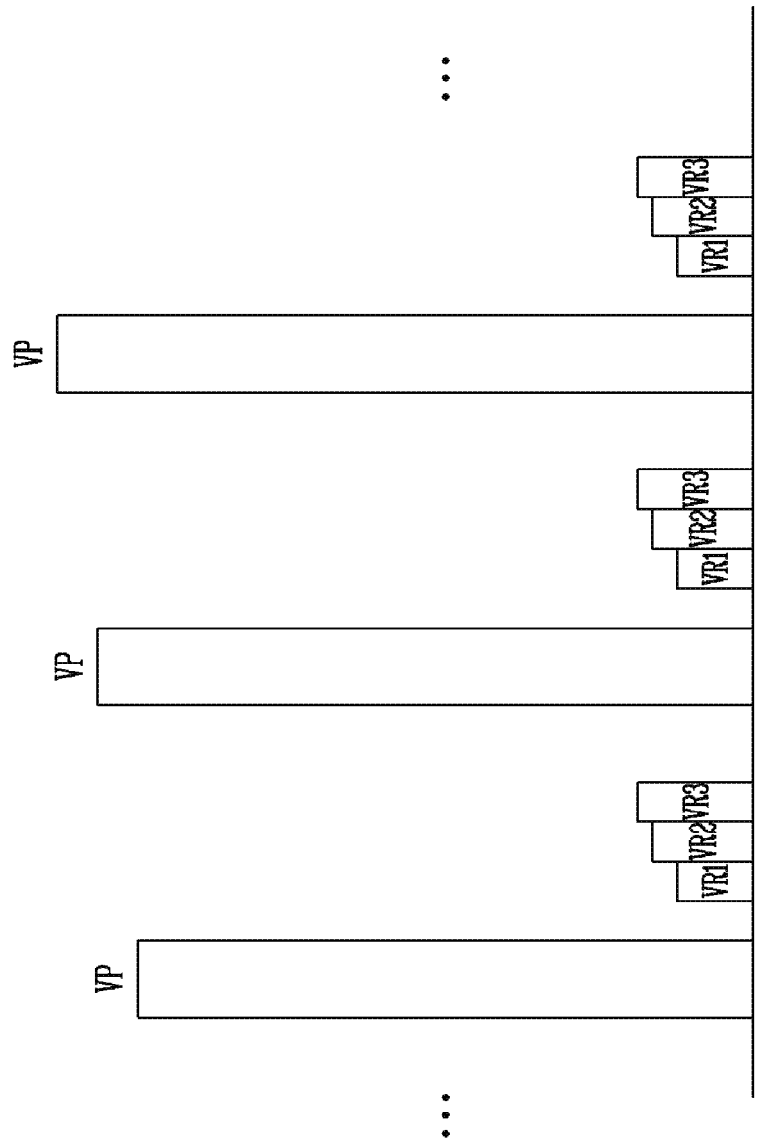
FIG. 14 is a graph illustrating a portion of a program operation of memory cells having a distribution state shown in FIG. 13.

FIG. 14 is a graph illustrating a portion of a program operation of memory cells having the distribution state shown in FIG. 13.

Referring to FIG. 14, a portion of a program operation using the ISPP method is illustrated. That is, the program operation includes a plurality of program loops, and each program loop includes step of increasing threshold voltages of memory cells by applying a program pulse VP and step of performing program verification of the memory cells by applying verify voltages VR1 to VR3. Three program loops are illustrated in FIG. 14.

Referring to FIGS. 13 and 14 together, because the intermediate state VTD2 of the threshold voltage distribution of the memory cells to be programmed is narrowly formed by decreasing the program speed of the fast cells as shown in FIG. 13, only verify operations using the first to third verify voltages are performed for every program loop. Referring to FIGS. 8 and 14 together, in FIG. 8, the verify operations using the first to fifth verify voltages VR1 to VR5 are all to be performed for every program loop. On the other hand, in FIG. 14, only verify operations using the first to third verify voltages VR1 to VR3 are performed, and thus the number of times that a verify operation is performed can be decreased. Accordingly, the program speed of the semiconductor memory device can be improved.

Figure 15:
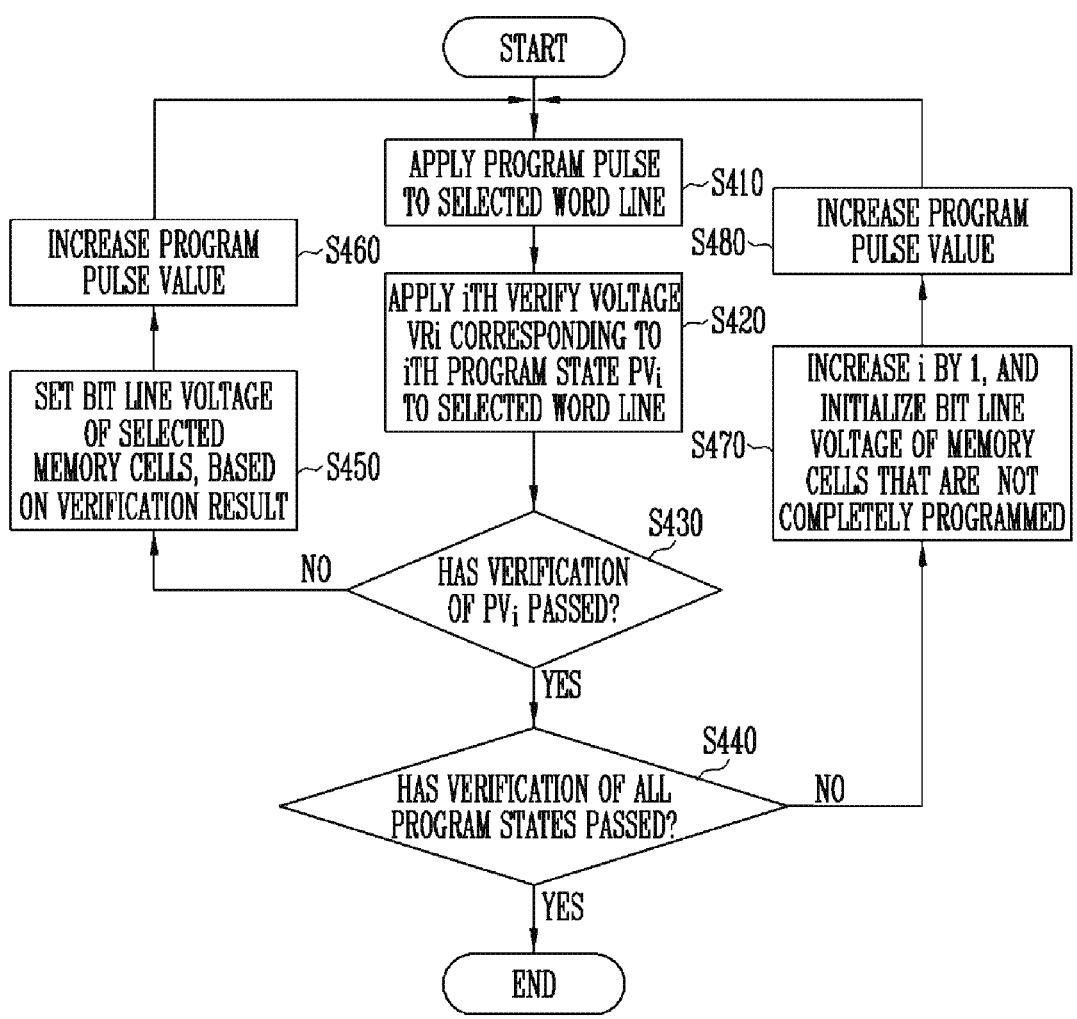
FIG. 15 is a flowchart illustrating an operating method of a semiconductor memory device, according to an embodiment of the present disclosure.

FIG. 15 is a flowchart illustrating an operating method of a semiconductor memory device according to an embodiment of the present disclosure. In FIG. 15, an operating method of the semiconductor memory device, which includes a plurality of program loops to program selected memory cells to any one program state among first to Nth program states, is illustrated. Here, the N may be a value determined according to a number of bits stored a memory cell to be programmed. In an example, in the case of a TLC that stores data of three bits as shown in FIG. 6, N may be 7. In another example, in the case of a MLC that stores data of two bits, N may be 1. In still another example, in the case of a QLC that stores data of four bits, N may be 15. As described above, when the number of bits stored in a memory cell is "b," N may have a value of "$2^b-1$."

Referring to FIG. 15, a verify operation on selected memory cells is performed by applying a program pulse to a selected word line (S410) and applying an ith verify voltage VRi corresponding to an ith program state $PV_i$ to the selected word line (S420). Here, the i may be a natural number larger than or equal to 1. Also, i may be a value determined according to a number of bits stored in a memory cell. For example, referring to FIGS. 6 and 15 together, in the case of a TLC that stores data of three bits, i may be a natural number that is larger than or equal to 1 and is smaller than or equal to 7.

In step S430, it is determined whether verification of the ith program state $PV_i$ has passed. That is, when all threshold voltages of memory cells that are to be programmed to the ith program state $PV_i$ among the selected memory cells exceeds the ith verify voltage VRi, the verification of the ith program state $PV_i$ passes.

When the verification of the ith program state $PV_i$ does not pass, a bit line voltage of the selected memory cells is set based on the verification result (S450). In the step S450, the bit line voltage is set based on the threshold voltages of the selected memory cells. More specifically, different bit line voltages may be set by dividing the selected memory cells into fast cells and slow cells according to the threshold voltages of the selected memory cells. That is, at least some of the memory cells having threshold voltages higher than the ith verify voltage VRi may be determined as fast cells. A bit line voltage of the memory cells determined as fast cells may be determined differently from that of memory cells determined as slow cells. A more detailed configuration of the step S450 is described below with reference to FIGS. 16, 17A, and 17B.

In step S460, a program pulse value of ISPP is increased. A subsequent program loop is performed by proceeding to the step S410.

The above-described steps S410, S420, S430, S450, and S460 may constitute one program loop for the ISPP method. The steps S410, S420, S430, S450, and S460 may be repeatedly performed until the verify operation of the ith program state $PV_i$ passes.

As the determination result of the step S430, when the verify operation of the ith program state $PV_i$ passes, it is determined whether verification of all program states has passed (S440). When the program state determined that its verification has passed in the step S430 is any one of the first to sixth program states $PV_1$ to $PV_6$ shown in FIG. 6, the verification of the seventh program state $PV_7$ does not pass, and therefore, the operating method proceeds to step S470.

In the step S470, the i that is an index representing a target determined whether its verification has passed is increased by 1, and a bit line voltage of memory cells that have not been completely programmed is initialized. The bit line voltage of memory cells that have been completely programmed may be maintained as a program inhibit voltage. The memory cells that have not been completely programmed are divided into fast cells and slow cells through the step S450 in a previous program, so that different bit line voltages are applied to the corresponding memory cells. In the step S470, the division of fast cells and slow cells is initialized, and a bit line voltage is applied by newly dividing the memory cells into fast cells and slow cells. This process is described below with reference to FIGS. 16, 17A, and 17B.

Subsequently, in step S480, the program pulse value of the ISPP is increased. A subsequent program loop is performed by proceeding to the step S410.

According to embodiments described with reference to FIGS. 9 to 14, selected memory cells to be programmed are dummy-programmed, and the dummy-programmed memory cells are divided into a first group and a second group, based on a predetermined reference voltage. On the other hand, according to an embodiment shown in FIGS. 15, 16, 17A, and 17B, which is described later, memory cells are divided into a first group and a second group, based on a verify voltage VRi corresponding to a program state $PV_i$ being verified. Accordingly, the verify voltage VRi that becomes a reference for dividing the memory cells into the first group and the second group is varied depending on a state in which the program operation is performed, and a bit line voltage can be applied by more flexibly distinguishing fast cells from slow cells.

Figure 16:
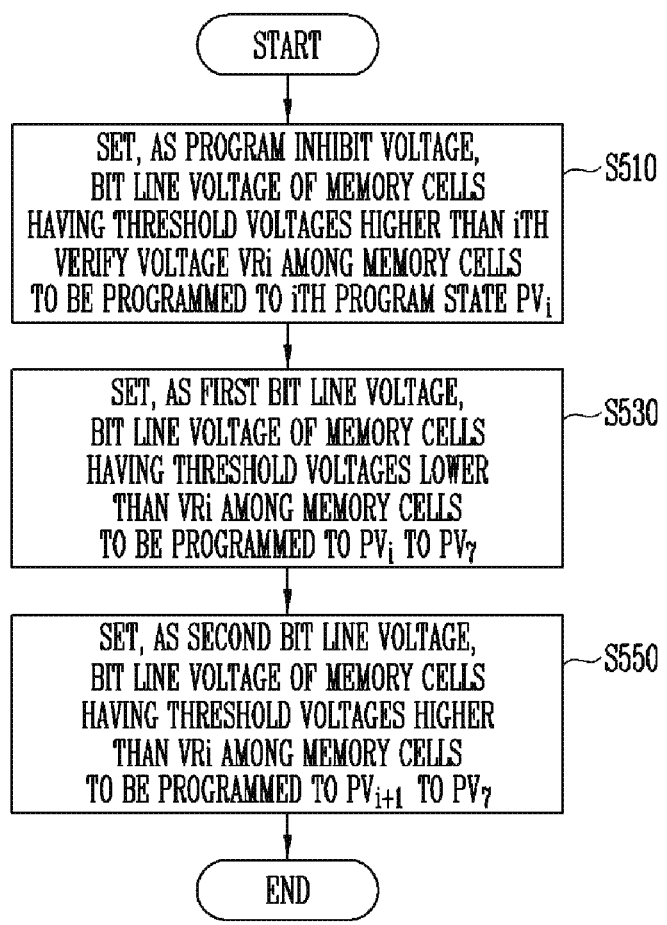
FIG. 16 is a flowchart illustrating, in more detail, an operation shown in FIG. 15.
Figure 17A:
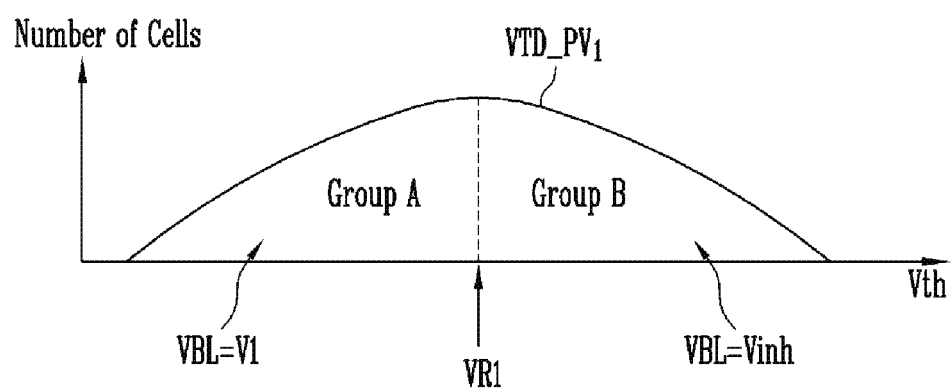
FIGS. 17A and 17B are diagrams illustrating bit line voltage settings shown in FIG. 16.
Figure 17B:
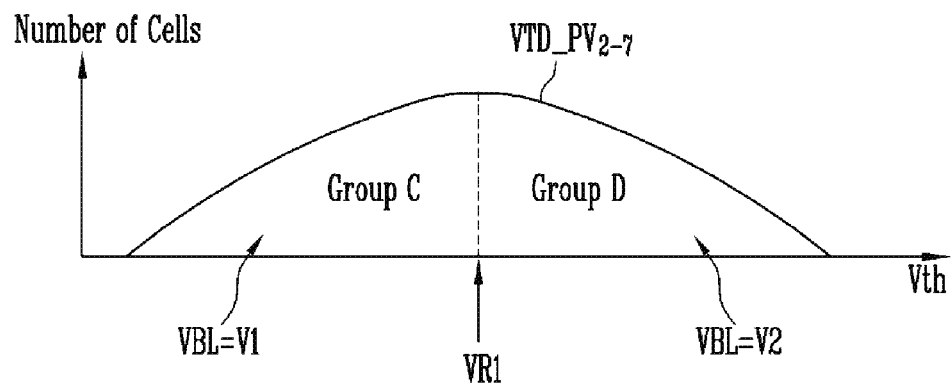

FIG. 16 is a flowchart illustrating in more detail the step S450 shown in FIG. 15. FIGS. 17A and 17B are diagrams illustrating the bit line voltage setting shown in FIG. 16. Hereinafter, a method for setting a bit line voltage of memory cells, based on a verify voltage VRi is described with reference to FIGS. 15, 16, 17A, and 17B together.

For convenience of description, a situation in which a program operation has not been completed with respect to the first program state $PV_i$ that is in an early stage of the program operation is described. Here, the i becomes 1.

In the step S410, the threshold voltages of the selected memory cells are increased by applying the program pulse to the selected word line. Subsequently, in the step S420, the first verify voltage VR1, that is a verify voltage corresponding to the first program state $PV_1$, is applied to the selected word line. Accordingly, it is determined whether the verification of the first program state $PV_1$ has passed.

Meanwhile, as the determination result of the step S430, when the verification of the first program state $PV_1$ does not pass, the operating method proceeds to the step S450.

Referring to FIG. 16, the step S450 includes steps S510, S530, and S550. An example related to the first program state is described. A bit line voltage of memory cells having threshold voltages higher than the first verify voltage VR1 among memory cells to be programmed to the first program state $PV_1$ is set as a program inhibit voltage (S510). Accordingly, in a subsequent program loop, the program inhibit voltage may be applied to a bit line coupled to memory cells having threshold voltages higher than the first verify voltage VR1 among the memory cells to be programmed to the first program state $PV_1$, i.e., memory cells that have been completely programmed. Referring to FIGS. 16 and 17A together, a threshold voltage distribution of memory cells to be programmed to the first program state $PV_1$ is illustrated as an intermediate state VTD_$PV_1$. In the step S510, a bit line voltage VBL of memory cells of Group B, which have been completely programmed to the first program state, is set as a program inhibit voltage $V_{inh}$.

In the step S530, a bit line voltage of memory cells having threshold voltages lower than the first verify voltage VR1 among memory cells to be programmed to the first to seventh program states $PV_1$ to $PV_7$ is set as a first bit line voltage V1.

Referring to FIGS. 16 and 17A together, in the step S530, a bit line voltage VBL of memory cells of Group A, which have not been completely programmed, among memory cells to be programmed to the first program state $PV_1$ is set as the first bit line voltage V1. In addition, referring to FIGS. 16 and 17B together, a threshold voltage distribution of memory cells to be programmed to the second to seventh program states $PV_2$ to $PV_7$ is illustrated as an intermediate state VTD_$PV_{2-7}$. In the step S530, a bit line voltage VBL of memory cells of Group C, which have not been completely programmed, among the memory cells to be programmed to the second to seventh program states $PV_2$ to $PV_7$ is set as the first bit line voltage V1. Referring to FIGS. 17A and 17B together, it can be seen that the bit line voltages VBL of the memory cells of Group A and Group C, which have not been completely programmed, are set as the first bit line voltage V1. Here, the memory cells of Group A are to be programmed to the first program state $PV_1$, and the memory cells of Group C are to be programmed to the second to seventh program states $PV_2$ to $PV_7$.

In the step S550, a bit line voltage of memory cells having threshold voltages higher than the first verify voltage VR1 among the memory cells to be programmed to the second to seventh program states $PV_2$ to $PV_7$ is set as a second bit line voltage V2. Referring to FIGS. 16 and 17B together, a bit line voltage VBL of memory cells belonging to Group D is set as the second bit line voltage V2.

Although a case where the steps S510, S530, and S550 are sequentially performed is illustrated in FIG. 16, the present disclosure is not limited thereto. The flowchart shown in FIG. 16 illustrates a method for setting a bit line voltage by dividing memory cells. Therefore, the order of the steps S510, S530, and S550 may be changed, and/or two or more steps may be performed at the same time.

Referring to FIGS. 17A and 17B together, the bit line voltage of the memory cells (Group B) that have been completely programmed among the memory cells to be programmed to the first program state $PV_1$ is set as the program inhibit voltage $V_{inh}$ (S510). The bit line voltages of the memory cells (Group A and Group C) having threshold voltages lower than the first verify voltage VR1 among the memory cells to be programmed to the first program state $PV_1$ (Group A) and to the second to seventh program states $PV_2$ to $PV_7$ (Group C) are set as the first bit line voltage V1 (S530). The bit line voltage of the memory cells (Group D) having threshold voltages higher than the first verify voltage VR1 among the memory cells to be programmed to the second to seventh program states $PV_2$ to $PV_7$ is set as the second bit line voltage V2 (S550). The second bit line voltage V2 may be greater than the first bit line voltage V1. In FIGS. 16, 17A, and 17B, the memory cells belonging to Group D may be determined as fast cells, and the memory cells belonging to Group A and Group C may be determined as slow cells. In the program operation, the second bit line voltage V2 relatively higher than the first bit line voltage V1 may be applied to the memory cells of Group D, which are determined as fast cells. The first bit line voltage V1 relatively lower than the second bit line voltage V2 may be applied to the memory cells belonging to Group A and Group C, which are determined as slow cells.

Accordingly, the program speed of fast cells is relatively decreased, and therefore, a variation in threshold voltage between memory cells being programmed is decreased. That is, in the intermediate state VTD_$PV_{2-7}$ shown in FIG. 17B, a variation in threshold voltage between the memory cells of Group D, which have threshold voltages higher than the first verify voltage VR1, is decreased. Thus, the number of verify operations performed in the program operation can be decreased, and accordingly, the program speed of the semiconductor memory device can be improved.

When a program loop is repeated, and the verification of the first program state $PV_1$ passes as the determination result of the step S430, i is increased from 1 to 2 through the step S470, and the bit line voltage is initialized. In a subsequent program loop, the steps S510, S530, and S550 shown in FIG. 16 are performed in a state in which i is 2.

That is, in the step S510, a bit line voltage of memory cells having threshold voltages higher than the second verify voltage VR2 among memory cells to be programmed to the second program state $PV_2$ is determined as a program inhibit voltage. Subsequently, in the step S530, a bit line voltage VBL of memory cells having threshold voltages lower than the second verify voltage VR2 among the memory cells to be programmed to the second to seventh program states $PV_2$ to $PV_7$ is determined as the first bit line voltage V1. In the step S550, a bit line voltage VBL of memory cells having threshold voltages higher than the second verify voltage VR2 among memory cells to be programmed to the third to seventh program states $PV_3$ to $PV_7$ is determined as the second bit line voltage V2. For some embodiments, the first bit line voltage V1 is different for different values of i, and the second bit line voltage V2 is different for different values of i. For other embodiments, the first bit line voltage V1 is different for some values of i, and the second bit line voltage V2 is different for different for some values of i. However, for any given value of i, the first bit line voltage V1 is greater than the second bit line voltage V2.

As described above, for a semiconductor memory device and an operating method thereof according to an embodiment of the present disclosure, when a program loop is repeatedly performed, a bit line voltage is adjusted by adaptively determining fast cells for every program loop. Referring to FIGS. 17A and 17B, it can be seen that the memory cells (Group C) having threshold voltages lower than the first verify voltage VR1 among the memory cells to be programmed to the second to seventh program states $PV_2$ to $PV_7$ are determined as slow cells, and the memory cells (Group D) having threshold voltages higher than the first verify voltage VR1 among the memory cells to be programmed to the second to seventh program states $PV_2$ to $PV_7$ are determined as fast cells, which are determined for every program loop.

In addition, a reference voltage for determining fast cells is adjusted whenever the verification of a specific program state passes. When the verification of the first program state $PV_1$ does not pass, a voltage that becomes a reference for distinguishing the fast cells (Group D) from the slow cells (Group A and Group C) is the first verify voltage VR1. If the verification of the first program state $PV_1$ passes when a program loop is performed, the voltage for distinguishing fast cells from slow cells may be changed to a second verify voltage VR2. Similarly, if the verification of the second program state $PV_2$ passes when a program loop is performed, the voltage for distinguishing fast cells from slow cells may be changed to a third verify voltage VR3.

FIG. 18 is a flowchart illustrating an operating method of the semiconductor memory device according to an embodiment of the present disclosure.

Referring to FIG. 18, first, a program pulse is applied to a selected word line (S610), and an ith verify voltage VRi corresponding to an ith program state $PV_i$ is applied to the selected word line (S620). Subsequently, in step S630, a number Nc of memory cells having threshold voltages higher than the ith verify voltage VRi is counted.

In step S640, it is determined whether the counted number Nc of memory cells is greater than a predetermined reference value N_ref. When the counted number Nc of memory cells is less than or equal to the predetermined reference value N_ref, a bit line voltage of the memory cells is set according to a first mode (S650). When the counted number Nc of memory cells is greater than the predetermined reference value N_ref, a bit line voltage of the memory cells is set according to a second mode different from the first mode (S660).

When the bit line voltage of the memory cells is set according to the first mode or the second mode, it is determined whether verification of the ith program state $PV_i$ has passed (S670). As the determination result of the step S670, when the verification of the ith program state $PV_i$ does not pass, a program pulse value is increased (S680), and a subsequent program loop is performed by proceeding to the step S610. As the determination result of the step S670, when the verification of the ith program state $PV_i$ passes, a program operation and a verify operation on upper program states $PV_{i+1}$ to $PV_7$ are performed (S690).

The steps S610 to S680 may constitute one program loop in the program operation. Meanwhile, the step S690 may include a plurality of program loops. For example, the steps S610 to S680 may constitute a program loop in a state in which i is increased to 2, and the step S690 may include a plurality of program loops.

When i is 1, in the embodiment shown in FIG. 18, the first mode or the second mode is determined according to a number of memory cells having threshold voltages higher than the first verify voltage VR1 among all the memory cells. In the first mode, the bit line voltage is set based on the threshold voltages of the selected memory cells. In the second mode, the bit line voltage is set without dividing the selected memory cells according to the threshold voltages of the selected memory cells.

When the number of memory cells having threshold voltages higher than the first verify voltage VR1 is small, this corresponds to an early stage of the program operation. Therefore, the memory cells having threshold voltages higher than the first verify voltage VR1 may be determined as fast cells at this early stage of the program operation. Accordingly, a bit line voltage for decreasing the program speed of the fast cells according to the first mode is applied to the fast cells.

In the first mode, the bit line voltage is set as described with reference to FIGS. 16, 17A, and 17B so as to decrease the program speed of the fast cells. That is, a bit line voltage of memory cells (fast cells) having threshold voltages higher than the ith verify voltage VRi among memory cells to be programmed to $PV_{i+1}$ to $PV_7$, based on the ith program state $PV_i$ of which verification does not currently pass, is set as the second bit line voltage V2 (S550). In the first mode, a bit line voltage of memory cells (slow cells) having threshold voltages lower than the ith verify voltage VRi is set as the first bit line voltage V1 (S530). Redundant descriptions of the method for setting a bit line voltage by distinguishing fast cells from slow cells as shown in FIGS. 16, 17A, and 17B are omitted.

When the number of memory cells having threshold voltages higher than the first verify voltage VR1 is large, this may mean that the program operation has been performed to a certain degree. Therefore, the memory cells having threshold voltages higher than the first verify voltage VR1 might not be determined as fast cells under the situation in which the program operation is performed to a certain degree. According to the second mode, the program operation is performed without distinguishing fast cells from slow cells.

In the second mode, fast cells and slow cells are not distinguished from each other during the program operation. Therefore, all bit line voltages of memory cells that have not been completely programmed are set equal to one another. This is described with reference to FIGS. 19 and 20 together.

Figure 19:
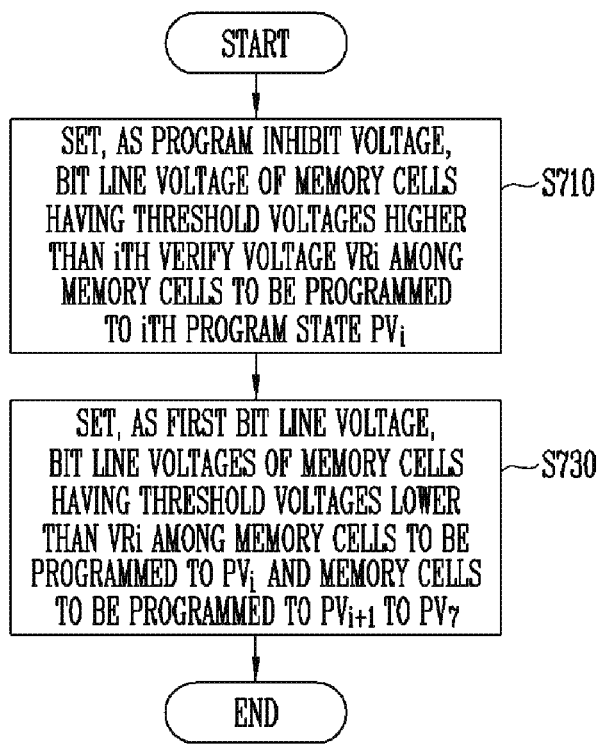
FIG. 19 is a flowchart illustrating, in more detailed, an operation shown in FIG. 18.
Figure 20:
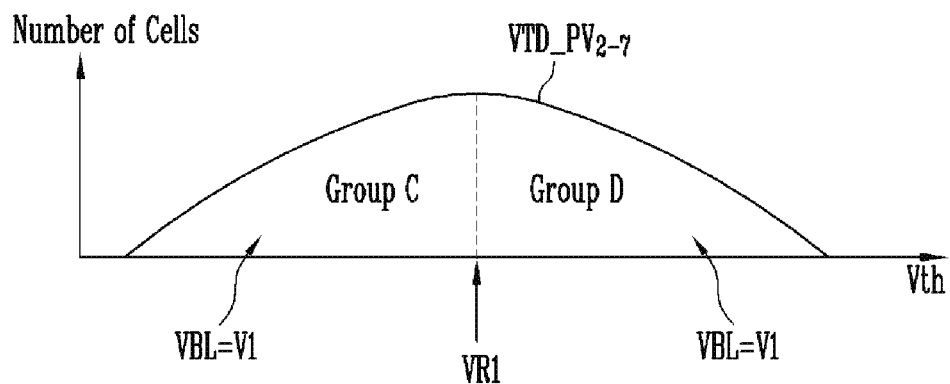
FIG. 20 is a diagram illustrating bit line voltage settings shown in FIG. 19.

FIG. 19 is a flowchart illustrating the step S660 shown in FIG. 18. FIG. 20 is a diagram illustrating the bit line voltage setting shown in FIG. 19. Hereinafter, a method for setting a bit line voltage of memory cells according to the second mode is described with reference to FIGS. 19 and 20.

For convenience of description, a situation in which a program operation has not been completed with respect to the first program state $PV_i$ that is an early stage of the program operation is described. Here, i is 1.

Referring to FIG. 19, the step S660, corresponding to the second mode, includes steps S710 and S730. An example related to the first program state is described. A bit line voltage of memory cells having threshold voltages higher than the first verify voltage VR1 among the memory cells to be programmed to the first program state $PV_1$ is set as a program inhibit voltage (S710). Accordingly, in a subsequent program loop, the program inhibit voltage may be applied to a bit line coupled to the memory cells having threshold voltages higher than the first verify voltage VR1 among the memory cells to be programmed to the first program state $PV_1$, i.e., memory cells that have been completely programmed. As shown in FIG. 17A, in the step S710, the bit line voltage VBL of the memory cells of Group B, which have been completely programmed to the first program state $PV_1$, is set as the program inhibit voltage $V_{inh}$.

In the step S730, a bit line voltage of memory cells having threshold voltages lower than the first verify voltage VR1 among the memory cells to be programmed to $PV_1$ and a bit line voltage of memory cells to be programmed to $PV_2$ to $PV_7$ are set as the first bit line voltage V1. Accordingly, the bit line voltage $VBL_1$ of the memory cells of Group A shown in FIG. 17A, i.e., the memory cells having threshold voltages lower than the first verify voltage VR1 among the memory cells to be programmed to $PV_1$, is set as the first bit line voltage V1. Similarly, the bit line voltage VBL of the memory cells of Groups C and D in FIG. 20 are also set to the first bit line voltage V1.

Referring to FIG. 20, a threshold voltage distribution of the memory cells to be programmed to the second to seventh program states $PV_2$ to $PV_7$ is illustrated as an intermediate state $VTD\_PV_{2-7}$. In the step S730, both the bit line voltages VBL of the memory cells of Group C, which have not been completely programmed, and the memory cells of Group D, which have been completely programmed, among the memory cells to be programmed to the second to seventh program states $PV_2$ to $PV_7$ are set as the first bit line voltage V1. Referring to FIGS. 17A and 20 together, it can be seen that both the bit line voltages VBL of the memory cells of Group A, which have not been completely programmed, among the memory cells to be programmed to the first program state $PV_i$ and the memory cells of the Group C and Group D, which are to be programmed to the second to seventh program states $PV_2$ to $PV_7$, are set as the first bit line voltage V1. The first bit line voltage V1 is a program allow voltage, and may be, for example, a ground voltage (0 V).

In the first mode, a bit line voltage of memory cells is set by dividing the memory cells into fast cells and slow cells, as shown in FIGS. 17A and 17B. In the second mode, a bit line voltage of memory cells is set without dividing the memory cells into fast cells and slow cells, as shown in FIGS. 17A and 20. Thus, at the early stage of the program operation, when the number Nc of memory cells having threshold voltages higher than the first verify voltage VR1 is less than or equal to the reference value N_ref, the program speed of fast cells can be intentionally decreased according to the first mode. Subsequently, when the number Nc of memory cells having threshold voltages higher than the first verify voltage VR1 is greater than the reference value N_ref because the program operation is performed to a certain degree, the same program allow voltage can be applied as the bit line voltage of the memory cells without diving the memory cells into slow cells and fast cells.

Figure 21:
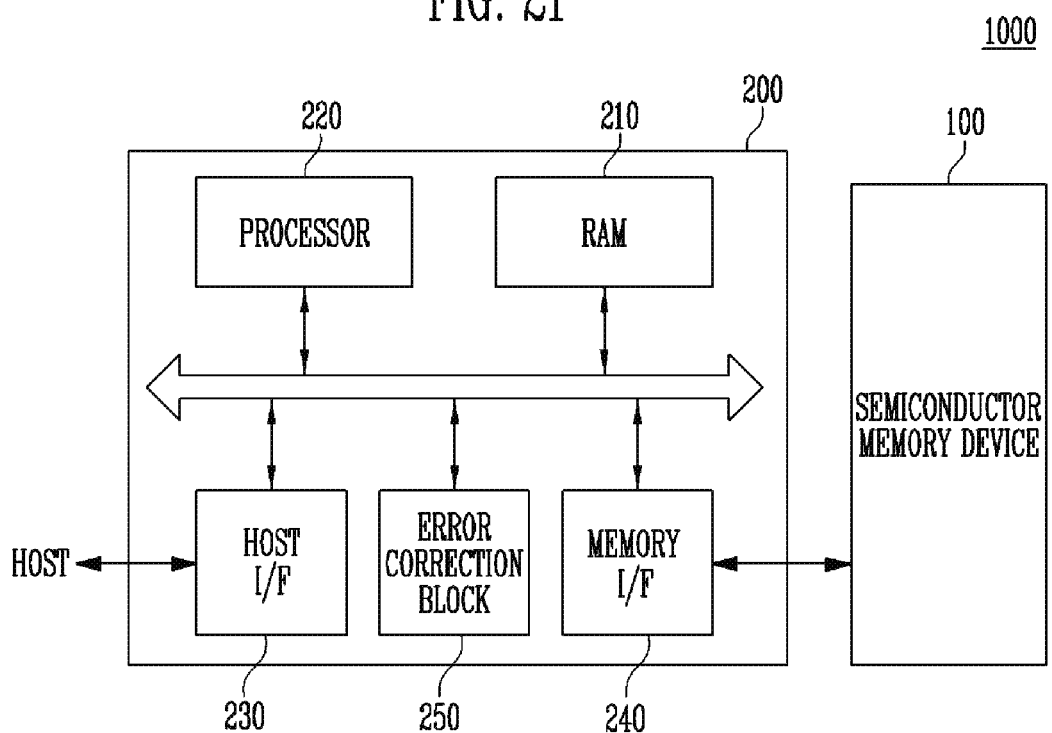
FIG. 21 is a block diagram illustrating an example of a storage device including the semiconductor memory device shown in FIG. 1 and a memory controller for controlling the semiconductor memory device.

FIG. 21 is a block diagram illustrating an example of a storage device 1000 including the semiconductor memory device shown in FIG. 1 and a memory controller 200 for controlling the semiconductor memory device 1000.

Referring to FIG. 21, the storage device 1000 includes the semiconductor memory device 100 and the memory controller 200. The memory controller 200 is coupled to the semiconductor memory device 100 and a host HOST. The semiconductor memory device 100 may be the semiconductor memory device described with reference to FIG. 1.

The memory controller 200 accesses the semiconductor memory device 100 in response to a request from the host HOST. For example, the memory controller 200 controls read, program, erase, and background operations of the semiconductor memory device 100. The memory controller 200 provides an interface between the semiconductor memory device 100 and the host HOST. The memory controller 200 drives firmware for controlling the semiconductor memory device 100.

The memory controller 200 includes a random access memory (RAM) 210, a processor 220, a host interface (I/F) 230, a memory I/F 240, and an error correction block 250.

The RAM 210 is used as a working memory of the processor 220, a cache memory between the semiconductor memory device 100 and the host HOST, and/or a buffer memory between the semiconductor memory device 100 and the host HOST. Also, the RAM 210 may be used as a command queue that temporarily stores commands to be transferred to the semiconductor memory device 100.

The processor 220 controls overall operations of the memory controller 200.

The host I/F 230 includes a protocol for exchanging data between the host HOST and the memory controller 200. In an embodiment, the memory controller 200 communicates with the host HOST through at least one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory I/F 240 interfaces with the semiconductor memory device 100. For example, the memory I/F 240 may include a NAND interface or a NOR interface.

The error correction block 250 detects and corrects an error of data received from the semiconductor memory device 100 by using an error correction code (ECC). The processor 220 may adjust a read voltage, based on the error detection result of the error correction block 250, and control the semiconductor memory device 100 to perform a re-read operation.

The memory controller 200 and the semiconductor memory device 100 may be integrated into one semiconductor device. In an embodiment, the memory controller 200 and the semiconductor memory device 100 may be integrated into one semiconductor device to constitute a memory card. For example, the memory controller 200 and the semiconductor memory device 100 may be integrated into one semiconductor device to constitute a memory card, such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The memory controller 200 and the semiconductor memory device 100 may be integrated into one semiconductor device to constitute a semiconductor drive (solid state drive (SSD)). The semiconductor drive SSD includes a storage device configured to store data in a semiconductor memory. When the storage device including the memory controller 200 and the semiconductor memory device 100 is used as the semiconductor drive SSD, the operating speed of the host HOST coupled to the storage device can be remarkably improved.

As another example, the storage device 1000 including the memory controller 200 and the semiconductor memory device 100 may be provided as one of various components of an electronic device, such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the storage device 1000 including the memory controller 200 and the semiconductor memory device 100 may be packaged in various forms. For example, the semiconductor memory device 100 or the storage device may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi-Chip Package (MCP), Wafer-level Fabricated Package (WFP), or Wafer-level processed Stack Package (WSP).

Figure 22:
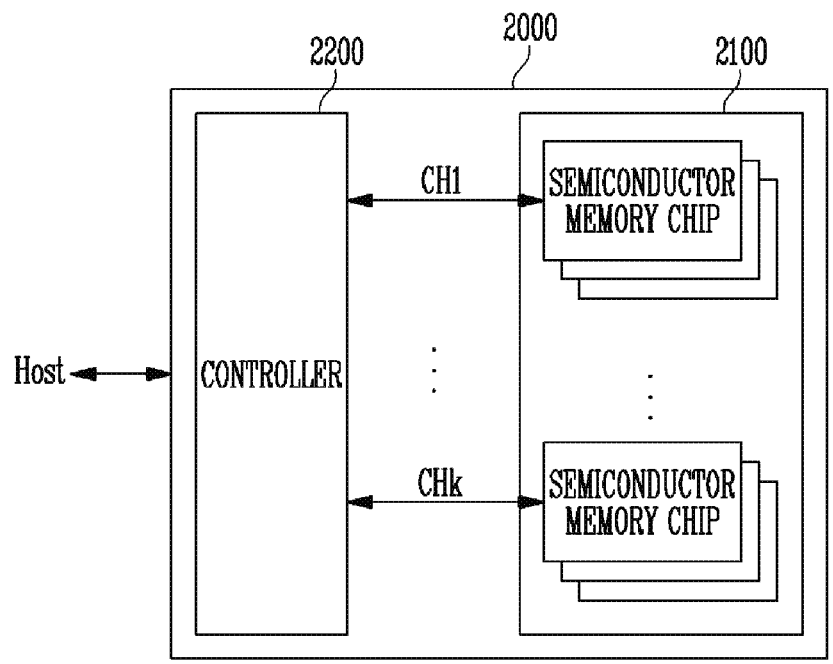
FIG. 22 is a block diagram illustrating an application example of the storage device shown in FIG. 21.

FIG. 22 is a block diagram illustrating an application example of the storage device 1000 shown in FIG. 21.

Referring to FIG. 22, a storage device 2000 includes a semiconductor memory device 2100 and a controller 2200. The semiconductor memory device 2100 includes a plurality of semiconductor memory chips. The plurality of semiconductor memory chips are divided into a plurality of groups.

FIG. 22 illustrates that the plurality of groups communicate with the controller 2200 through first to kth channels CH1 to CHk. Each semiconductor memory chip may be configured and operated identically to the semiconductor memory device 100 described with reference to FIG. 1.

Each group is configured to communicate with the controller 2200 through one common channel. The controller 2200 is configured identically to the memory controller 200 described with reference to FIG. 21. The controller 2200 controls the plurality of memory chips of the semiconductor memory device 2100 through the plurality of channels CH1 to CHk.

Figure 23:
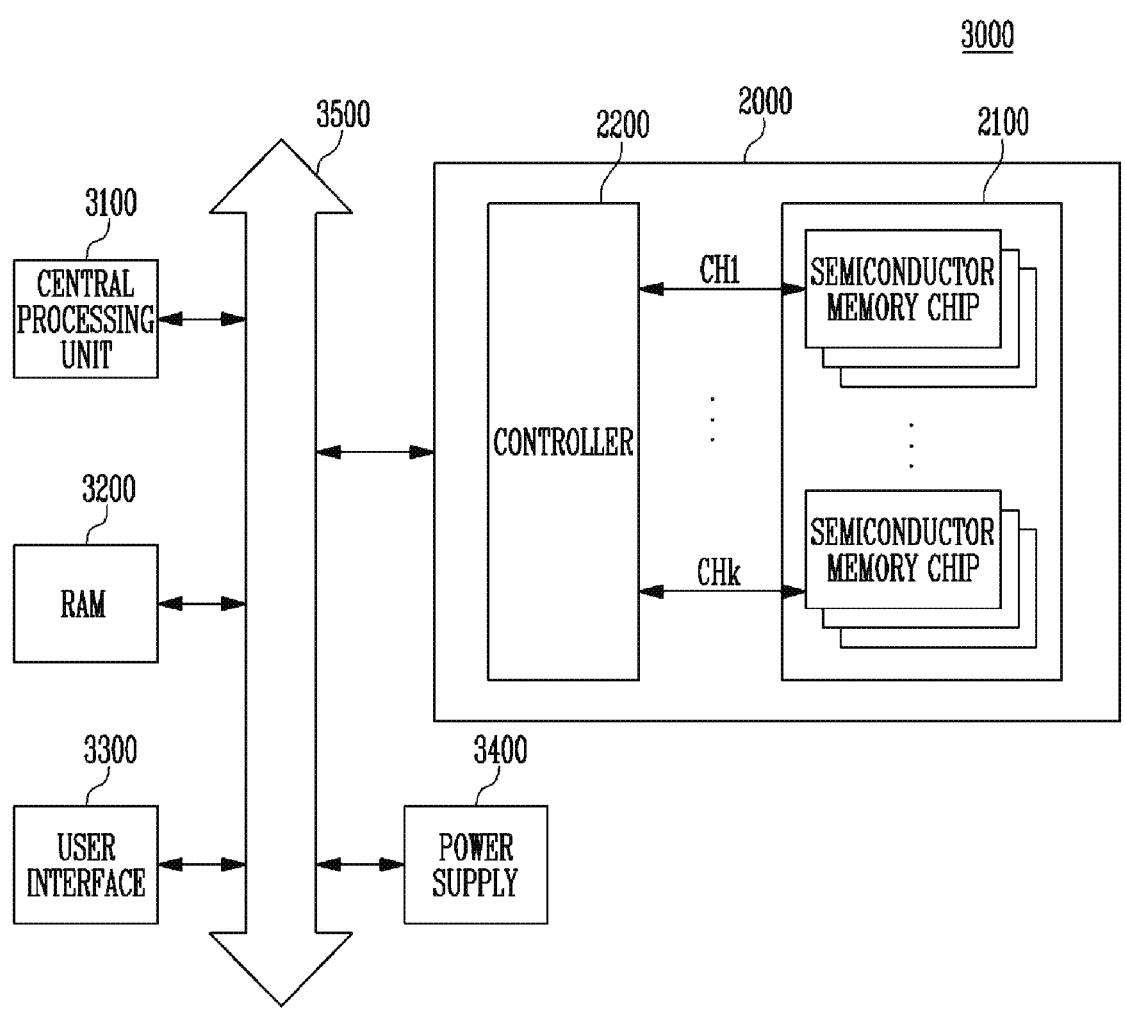
FIG. 23 is a block diagram illustrating a computing system including the storage device described with reference to FIG. 22.

FIG. 23 is a block diagram illustrating a computing system 3000 including the storage device 2000 described with reference to FIG. 22.

Referring to FIG. 23, the computing system 3000 includes a central processing unit 3100, a RAM 3200, a user interface 3300, a power supply 3400, a system bus 3500, and the storage device 2000.

The storage device 2000 is electrically coupled to the central processing unit 3100, the RAM 3200, the user interface 3300, and the power supply 3400 through the system bus 3500. Data supplied through the user interface 3300 or data processed by the central processing unit 3100 are stored in the storage device 2000.

FIG. 23 illustrates that the semiconductor memory device 2100 is coupled to the system bus 3500 through the controller 2200. However, the semiconductor memory device 2100 may be directly coupled to the system bus 3500. The function of the controller 2200 may be performed by the central processing unit 3100 and the RAM 3200.

FIG. 23 illustrates that the storage device 2000 described with reference to FIG. 22 is provided. However, the storage device 2000 may be replaced by the storage device 1000 including the memory controller 200 and the semiconductor memory device 100, which are described with reference to FIG. 21.

A number of embodiments of the present disclosure provide a semiconductor memory device having an improved program speed. Additional embodiments of the present disclosure provide an operating method of the semiconductor memory device.

While the present disclosure has been shown and described with reference to certain embodiments, it will be understood by those skilled in the art that various changes in form and detail may be made to the embodiments without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or a portion of the steps may be performed while others are omitted. In each embodiment, indicated steps are not necessarily performed in the order described and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method for operating a semiconductor memory device, the method comprising:
  dummy-programming selected memory cells representing all the memory cells to be programmed for a programming operation;
  determining as a first group of memory cells those selected memory cells having threshold voltages less than or equal to a reference threshold voltage;
  determining as a second group of memory cells those selected memory cells having threshold voltages greater than the reference threshold voltage;
  programming the selected memory cells, wherein programming the selected memory cells comprises:
    applying a first bit line voltage to the memory cells of the first group;
    applying a second bit line voltage different from the first bit line voltage to the memory cells of the second group; and applying a same program pulse to the memory cells of the first and second groups.

2. The method of claim 1, wherein the second bit line voltage is higher than the first bit line voltage.

3. The method of claim 2, wherein the second bit line voltage is lower than a voltage of the program pulse.

4. The method of claim 1, wherein:
applying a first bit line voltage to the memory cells of the first group comprises applying the first bit line voltage to bit lines coupled to the memory cells of the first group; and
applying a second bit line voltage to the memory cells of the second group comprises applying the second bit line voltage to bit lines coupled to the memory cells of the second group.

5. A semiconductor memory device comprising:
a memory cell array comprising a plurality of memory cells configured to store data;
a plurality of bit lines coupled to the plurality of memory cells;
a peripheral circuit configured to perform a program operation on all selected memory cells among the plurality of memory cells; and
a control logic configured to control the peripheral circuit in performing the program operation,
wherein the semiconductor memory device, in performing the program operation, is configured to:
dummy-program the selected memory cells;
determine as a first group of memory cells those selected memory cells having threshold voltages less than or equal to a reference threshold voltage;
determine as a second group of memory cells those selected memory cells having threshold voltages greater than the reference threshold voltage;
apply a first bit line voltage to bit lines, of the plurality of bit lines, coupled to the memory cells of the first group;
apply a second bit line voltage higher than the first bit line voltage to bit lines, of the plurality of bit lines, coupled to the memory cells of the second group; and
apply a same program pulse to the memory cells of the first and second groups.

6. The semiconductor memory device of claim 5, wherein the second bit line voltage is lower than a voltage of the program pulse.

* * * * *

UNITED STATES PATENT AND TRADEMARK OFFICE
CERTIFICATE OF CORRECTION

| | | |
|---|---|---|
| PATENT NO. | : 10,885,993 B2 | Page 1 of 1 |
| APPLICATION NO. | : 16/598922 | |
| DATED | : January 5, 2021 | |
| INVENTOR(S) | : Hee Youl Lee | |

It is certified that error appears in the above-identified patent and that said Letters Patent is hereby corrected as shown below:

On the Title Page

Item (71) Applicant:
Replace "SK hynix Inc., Incheon-si (KR)" with --SK hynix Inc., Icheon-si Gyeonggi-do (KR)--

Item (72) Inventor:
Replace "Hee Youl Lee, Incheon-si (KR)" with --Hee Youl LEE, Icheon-si Gyeonggi-do (KR)--

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*